US011239542B2

(12) United States Patent
Vaisband et al.

(10) Patent No.: US 11,239,542 B2
(45) Date of Patent: Feb. 1, 2022

(54) NETWORK ON INTERCONNECT FABRIC AND INTEGRATED ANTENNA

(71) Applicant: THE REGENTS OF THE UNIVERSITY OF CALIFORNIA, Oakland, CA (US)

(72) Inventors: Boris Vaisband, Los Angeles, CA (US); Subramanian S. Iyer, Los Angeles, CA (US); Adeel A. Bajwa, Los Angeles, CA (US); Arpan Dasgupta, Los Angeles, CA (US); Arsalan Alam, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 17/013,166

(22) Filed: Sep. 4, 2020

(65) Prior Publication Data

US 2020/0403293 A1    Dec. 24, 2020

Related U.S. Application Data

(63) Continuation-in-part of application No. PCT/US2019/020717, filed on Mar. 5, 2019.

(60) Provisional application No. 62/639,301, filed on Mar. 6, 2018.

(51) Int. Cl.
*H01Q 23/00* (2006.01)
*H01Q 1/22* (2006.01)
*H01Q 9/04* (2006.01)

(52) U.S. Cl.
CPC ......... *H01Q 1/2283* (2013.01); *H01Q 9/0407* (2013.01); *H01Q 23/00* (2013.01)

(58) Field of Classification Search
CPC ............................ H01Q 1/2283; H01Q 23/00
USPC ........................................................ 343/702
See application file for complete search history.

(56) References Cited

U.S. PATENT DOCUMENTS

| | | | |
|---|---|---|---|
| 2009/0103855 | A1 | 4/2009 | Binkert et al. |
| 2009/0194768 | A1 | 8/2009 | Leedy |
| 2011/0037497 | A1 | 2/2011 | Or-Bach |
| 2012/0223738 | A1 | 9/2012 | Or-Bach et al. |
| 2015/0001709 | A1 | 1/2015 | Bao et al. |
| 2020/0366003 | A1* | 11/2020 | Kim .................. H01Q 21/28 |
| 2021/0202312 | A1* | 7/2021 | Yu ................... H01L 21/76898 |

OTHER PUBLICATIONS

International Search Report and Written opinion for PCT Application No. PCT/US2019/020717 dated Feb. 7, 2020, 12 pages.

* cited by examiner

*Primary Examiner* — Peguy Jean Pierre
(74) *Attorney, Agent, or Firm* — Foley & Lardner LLP

(57) ABSTRACT

A system is provided for interconnecting multiple functional dies on a single substrate, including: (1) multiple global links in the substrate; (2) multiple local links in the substrate; and (3) multiple utility dies on the substrate, wherein each of the utility dies is connected to at least one of the global links, the utility dies are configured to communicate with one another through the global links, each of the utility dies is connected to at least one of the local links and is configured to communicate with at least one of the functional dies through the at least one of the local links. In some embodiments, an antenna is integrated into the substrate.

24 Claims, 25 Drawing Sheets

1200

Thermally grown SiO2

Expose and Develop

Spin Coat Photoresist

Etch Oxide

Etch Silicon

NETWORK ON INTERCONNECT FABRIC AND INTEGRATED ANTENNA

CROSS-REFERENCE TO RELATED APPLICATIONS

This application is a continuation-in-part of PCT Application No. PCT/US2019/020717 filed Mar. 5, 2019, which application claims the benefit of U.S. Provisional Application No. 62/639,301, filed Mar. 6, 2018, the contents of all such applications being incorporated herein by reference in their entirety.

STATEMENT REGARDING FEDERALLY SPONSORED RESEARCH OR DEVELOPMENT

This invention was made with Government support under Grant Number FA8650-16-1-7648, awarded by the U.S. Air Force Materiel Command, Grant Number N00014-16-1-2639, awarded by the U.S. Navy, Office of Naval Research and Grant Number N00014-18-1-2638, awarded by the U.S. Navy, Office of Naval Research. The Government has certain rights in the invention.

TECHNICAL FIELD

This disclosure generally relates to a silicon interconnect fabric (Si-IF) and, in particular, to a network within the Si-IF.

BACKGROUND

Si-IF supports integration of bare dies using thermal compression bonding on a Si wafer substrate. Fine pitch (e.g., about 2 µm to about 10 µm) horizontal and vertical interconnects can be implemented within the Si-IF using Si processing techniques.

It is against this background that a need arose to develop the embodiments described herein.

SUMMARY

In some embodiments, a network on interconnect fabric (NoIF) is proposed in this disclosure. The NoIF allows integration of ultra large scale heterogeneous systems within the Si-IF platform. NoIF is based on utility dies which serve as intelligent nodes within the network. NoIF supports global communication; power management and regulation; synchronization; processing and memory capabilities; redundancy allocation; and testing of the Si-IF, and the utility and functional dies.

In some embodiments, a system is provided for interconnecting multiple functional dies on a single substrate, including: (1) multiple global links in the substrate; (2) multiple local links in the substrate; and (3) multiple utility dies on the substrate, wherein each of the utility dies is connected to at least one of the global links, the utility dies are configured to communicate with one another through the global links, each of the utility dies is connected to at least one of the local links and is configured to communicate with at least one of the functional dies through the at least one of the local links.

In some embodiments, a system includes: (1) a single substrate to accommodate multiple functional dies on the substrate, wherein the substrate includes: (a) multiple global links in the substrate, and (b) multiple local links in the substrate; and (2) multiple utility dies on the substrate, wherein each of the utility dies is connected to at least one of the global links, the utility dies are configured to communicate with one another through the global links, each of the utility dies is connected to at least one of the local links and is configured to communicate with at least one of the functional dies through the at least one of the local links.

In some embodiments, a system for interconnecting a plurality of functional dies on a single substrate includes: (1) multiple global links on or within or otherwise included in the substrate; (2) multiple local links on or within or otherwise included in the substrate; (3) multiple utility dies on the substrate, wherein each of the utility dies is connected to at least one of the global links, the utility dies are configured to communicate with one another through the global links, each of the utility dies is connected to at least one of the local links and is configured to communicate with at least one of the functional dies through the at least one of the local links; and (4) an antenna integrated on the substrate. In some embodiments, the antenna is integrated via a fused silica substrate technique. In some embodiments, the antenna is integrated via a PDMS substrate technique. In some embodiments, the antenna is a patch antenna.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

DETAILED DESCRIPTION

I. Introduction

Advanced applications include a variety of heterogeneous circuit blocks. Diverse technologies, substrate and interconnect materials, and processes coexist within a single system. In addition to heterogeneity, ultra large scale integration is specified for a variety of applications, such as neuromorphic systems. Si-IF is a compatible platform to satisfy the demands of advanced systems.

On-chip dimensions have been aggressively scaling for several decades. The scaling of packages and printed circuit boards (PCBs), however, has been almost stagnant during this time. Due to the difference in scaling pace, on-chip input/outputs (I/Os) exhibit a significantly smaller pitch (e.g., a few μm) than package-level controlled collapse chip connection (C4) bumps (e.g., tens of μm) and PCB-level ball grid arrays (e.g., hundreds of μm). Effectively, the package is used to space-out the on-chip interconnect to match the PCB. In addition, the package is large and a distance between packages can be on the order of tens of millimeters. An interposer platform can be used to alleviate the issues associated with long board-level interconnects, reducing the distance between chips on the interposer to about ten millimeters. Si-IF provides an opportunity to overcome both the distance between chips and the large vertical interconnect pitch.

Figure 1:
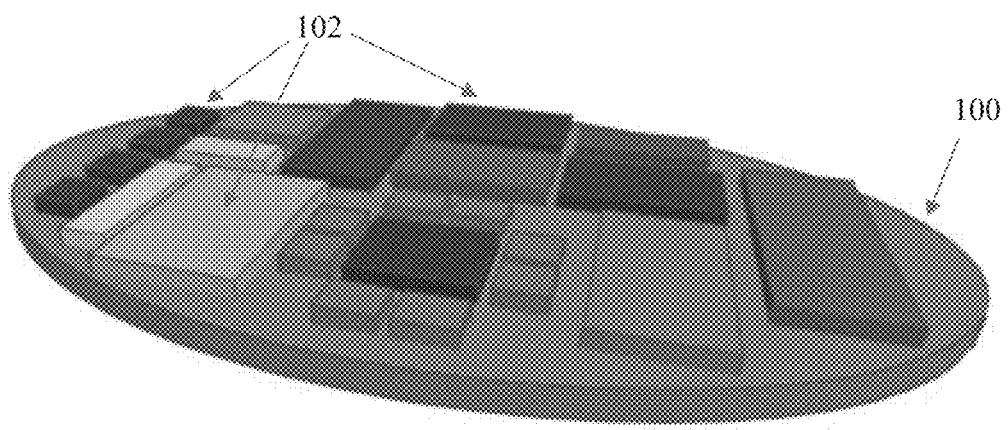
FIG. 1. An illustration of an about 300 mm diameter Si-IF populated with heterogeneous dies.

Bare (unpackaged) dies are placed directly on a passive Si-IF platform that effectively replaces a PCB. Many dies, each independently fabricated using a respective technology and process, are integrated within the Si-IF creating an ultra large scale heterogeneous system within a single platform. The dies are connected using fine pitch vertical interconnects (e.g., pillars formed of copper or another metal or metal alloy) disposed directly on the Si-IF. For example, an entire about 300 mm diameter silicon substrate 100 of the Si-IF can be populated with disparate dies 102 of different sizes and aspect ratios, as illustrated in FIG. 1. The pitch of the vertical pillars that are used to bond dies 102 to the Si-IF is on the order of a few μm, and the minimal distance between adjacent dies 102 on the Si-IF is about 50 μm to about 100 μm.

To be a practical platform for ultra large scale heterogeneous integration, system-level issues in Si-IF should be addressed. A network on interconnect fabric (NoIF) is proposed in this disclosure to support global communication, power regulation and management, synchronization, and to facilitate testing within the Si-IF. Unlike a network on chip (NoC) that is designed within a system on chip (SoC), the Si-IF is a passive platform for interconnect and other passive components (e.g., capacitors and inductors). Utility dies (UDs), therefore, serve as intelligent nodes within the NoIF. The following describes the NoIF and the UDs as components within the network.

It is also considered desirable to investigate the integration of K-band antennas on the Silicon-Interconnect Fabric (Si-IF). However, the challenge of using silicon as the interconnect substrate instead of an organic substrate, is the fact that silicon is a semiconductor due to which, the majority of the input signal couples into the substrate rather than the atmosphere. Using existing CMOS technologies to deposit silicon dioxide is also not a solution, since a large distance between the antenna and the ground plane is needed to work as an efficient radiator. For mm Wave frequencies, the distance needs to be at least 300 m for a near 100% efficiency, which is practically not feasible. As a result, on chip antennas have mostly been reported to being extremely lossy, limiting their transmission performance and range. Through the process flow reported in this paper, we provide a way to replace onchip antennas with antennas on low loss substrates.

It is proposed herein to use Fused Silica dies, which is amorphous silicon dioxide in bulk form, and explore means to integrate them onto the Silicon-Interconnect Fabric. Fused Silica, and other glass based materials are the best choices for antenna substrates in terms of low loss transmission. However, the process to integrate dies is challenging. Organic substrates, though inferior in terms of losses when compared to glass, provide an easier means of fabrication. As a result, embodiments include the use of organic substrates as a viable alternative to provide RF communication. A second method has also been developed using poly-di-methyl-siloxane (PDMS) as a substrate. Although both process flows have been developed for the Si-IF, they can also be adapted to replace lossy on chip antennas in other applications with low-loss, high efficiency antennas.

The disclosure is composed of the following sections. The Si-IF technology is presented in Section II. An overview of the proposed NoIF is provided in Section III. Architecture, design, and test aspects related to the NoIF approach are discussed in Section IV. Integration of an antenna in the Si-IF is described in Section V. Some conclusions are provided in Section VI, followed by example embodiments in Section VII.

II. Silicon Interconnect Fabric

Figure 2:
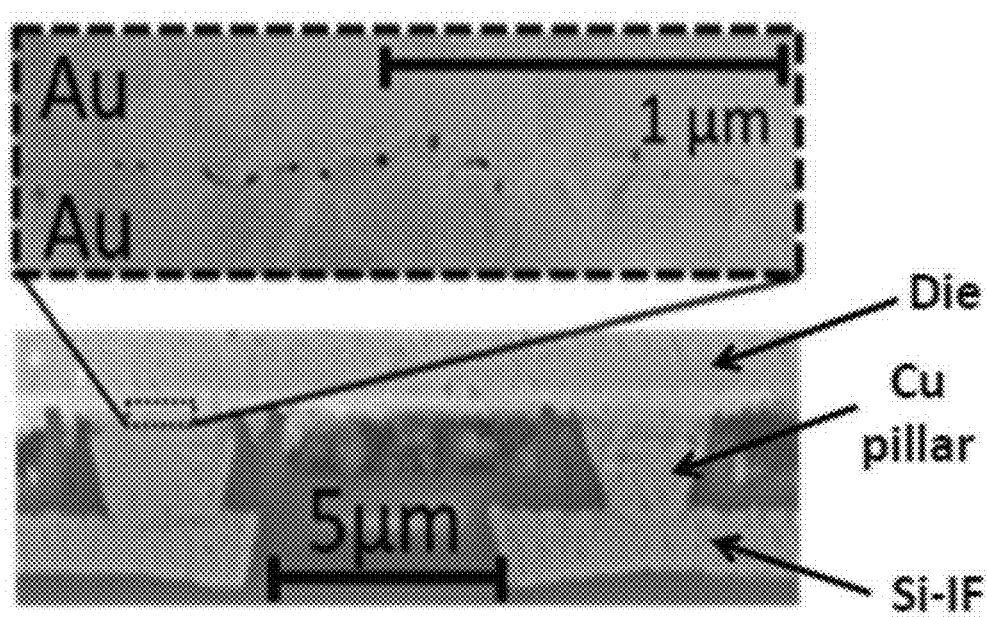
FIG. 2. Scanning electron microscopy (SEM) cross section of fine pitch interconnects. Bond interface is shown in inset.
Figure 3:
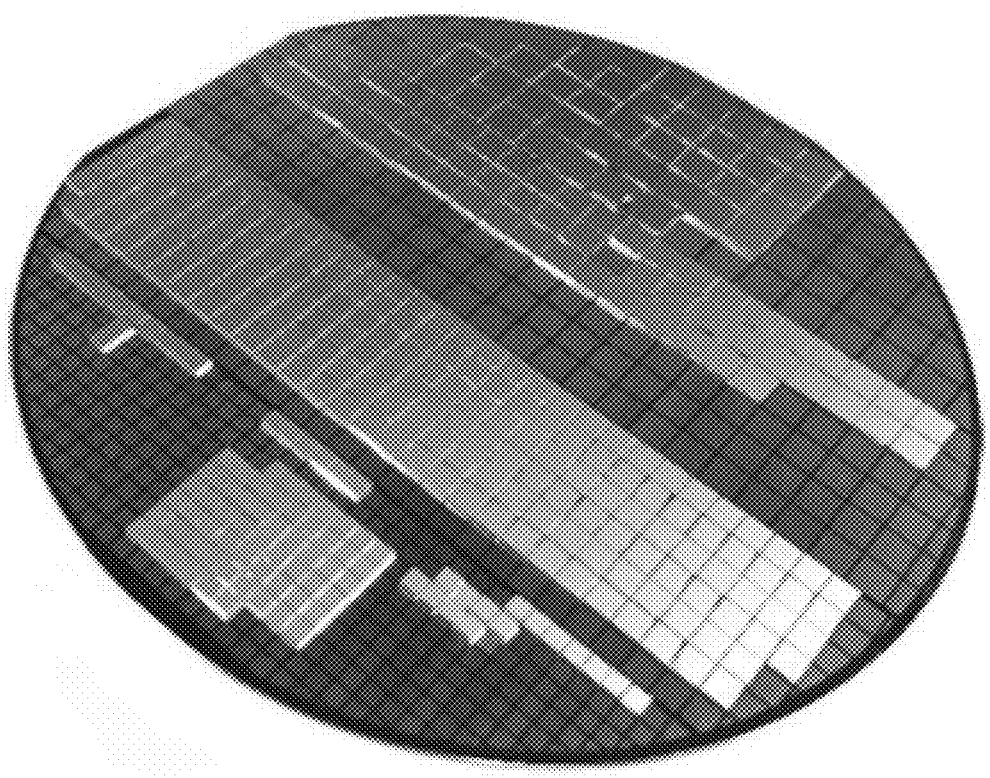
FIG. 3. About 100 mm Si-IF fabricated with a large number of dies of different sizes (about 4, about 9, about 16, and about 25 mm$^2$), attached with about 10 µm pitch.

An advantage of the Si-IF technology is that it is based on mature silicon fabrication processes. The Si-IF can include a silicon substrate in the form of a silicon wafer of typical size (e.g., a diameter of about 300 mm), with up to four or more copper (Cu) metallic layers including interconnects having a pitch of about 2 μm to about 10 μm, and fabricated using damascene process. Si-IF interconnects are terminated with Cu pillars (capped with gold (Au)) with height and diameter dimensions of about 2 μm to about 5 μm. The Si-IF platform can accommodate heterogeneous dies of various sizes (e.g., edge length of about 0.5 mm to about 5 mm), various aspect ratios, various substrate and interconnect materials, and various fabrication processes. Each die is bonded to the Cu pillars on the Si-IF using thermal compression bonding (TCB) process, as demonstrated in FIG. 2. Packages and PCBs become obsolete when utilizing the Si-IF technology; effectively, the Si-IF replaces the PCB and is directly connected to an interface socket using peripheral connectors (e.g., connectors 406 shown in FIG. 4). A fabricated Si-IF with a large number of dies of different sizes (e.g., about 4, about 9, about 16, and about 25 mm$^2$) is demonstrated in FIG. 3. The dies are attached at about 10 μm pitch, as compared to about 400 μm pitch on a PCB To further emphasize the advantages of Si-IF over C4 and micro-bumps (μ-bumps), a comparison of geometric and electrical properties of these technologies is summarized in Table I. The Cu pillars, utilized by the Si-IF technology, exhibit superior characteristics as compared to the other technologies. The small diameter of the Cu pillars supports a large number of I/Os between a die and the Si-IF, whereas the low effective contact resistance of the pillars alleviates signal degradation issues and reduces power.

In addition to the favorable geometric and electrical properties, the Si-IF technology exhibits improved thermal characteristics. A silicon substrate has a significantly lower thermal conductivity as compared to other substrates, such as glass-reinforced epoxy laminates (FR4), making the Si-IF an effective heat spreader. Coefficient of thermal expansion (CTE) mismatch between the Si-IF and typical Si dies is also low, leading to reduced thermal-mechanical stress.

TABLE I

COMPARISON OF GEOMETRIC AND ELECTRICAL PROPERTIES OF CU PILLARS (CAPPED WITH AU), C4 AND μ-BUMPS

| Interconnect type | Dimeter [μm] | Contact pad area [μm$^2$] | Specific contact resistance [Ω · μm$^2$] |
|---|---|---|---|
| C4 bump [6] | 100 | ~7,800 | 78 |
| C4 bump [6] | 50 | ~1,950 | 48.7 |
| μ-bump [7] | 23 | ~415 | 19.5 |
| μ-bump [7] | 16 | ~201 | 8.64 |
| Cu pillar [4] | 5 | ~19.5 | 0.82 |

III. Overview of Network on Interconnect Fabric

Although the Si-IF technology can support ultra large scale heterogeneous integration, as described in Section II, the system can face system-level design and test challenges. For example, global routing congestion and excessive power dissipation in interconnects can occur in large scale systems.

Figure 4:
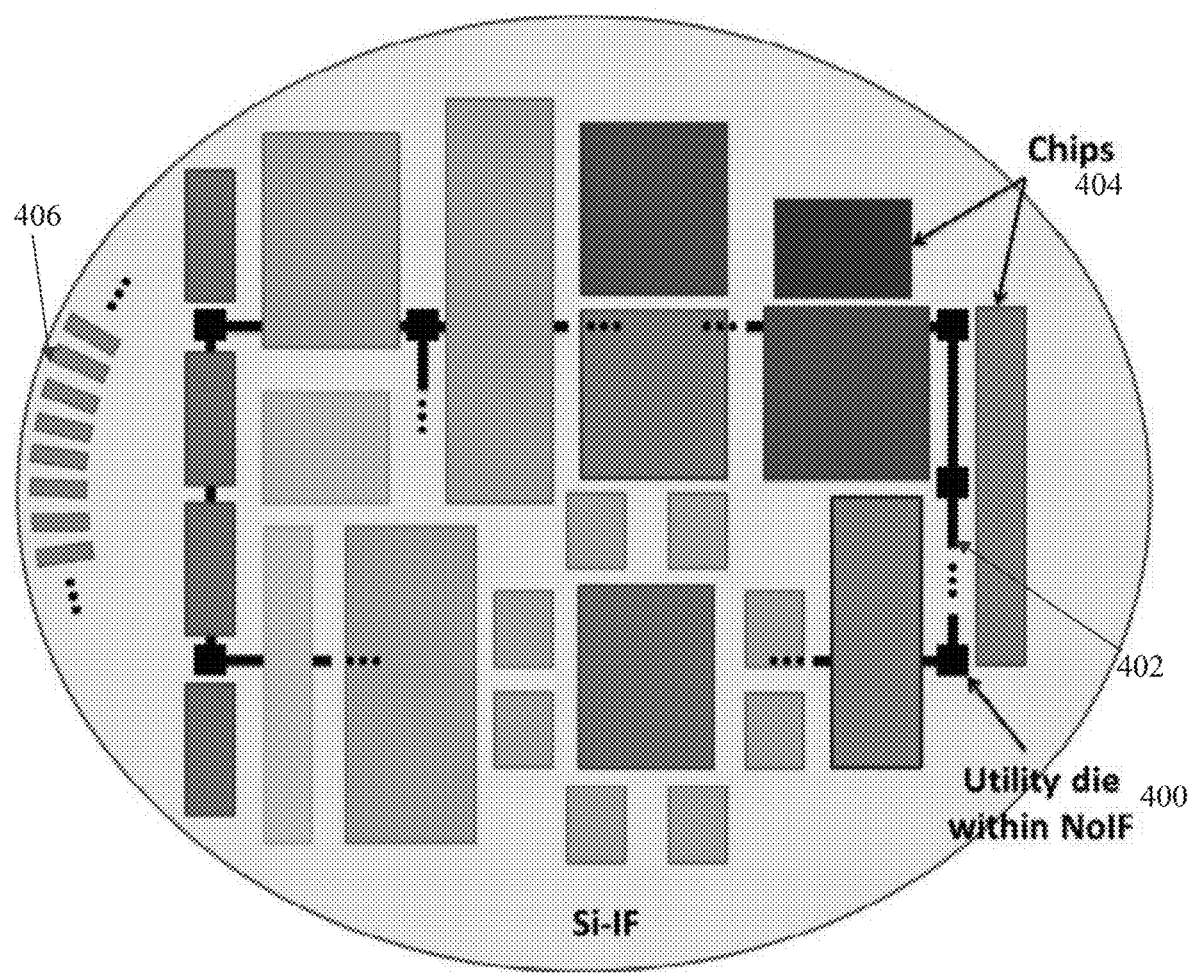
FIG. 4. System-level schematic of an NoIF including utility dies, serving as nodes within the NoIF.

Since the Si-IF includes a passive substrate where each component is a die, dedicated UDs are used as nodes within an NoIF. Each UD includes circuit components to manage various service aspects of nearby dies, including global communication within the Si-IF. A system-level schematic of an NoIF of some embodiments is depicted in FIG. 4. Unlike in NoCs where the location of each routing node is arbitrarily specified (e.g., an actual physical placement can be anywhere on a chip), nodes of the NoIF are UDs 400 that are placed in appropriate physical locations using the same TCB process as any other die within the system, including functional dies 404. UDs 400 are connected using global interconnects 402 (or global signal lines or global links, such as in the form of wires, serializer/deserializer circuits, and wireless or optical communication links) that serve as routing paths for global communication of data and other management signals.

NoIF supports a wide variety of services due to the capability of the Si-IF. Unlike NoCs, where nodes are typically dedicated to global routing, UDs within the NoIF include small dies (e.g., dielets on the order of about 1 mm$^2$) that include intelligent components to perform multiple tasks (a detailed discussion of the tasks is provided in Section IV), such as:

(1) Global routing—NoIF supports global communication between remotely placed dies.

(2) Power regulation and management—each UD includes power regulation circuits, for example, linear drop out (LDO) regulators. In addition to regulation, UDs support power management across the entire Si-IF to ensure stability and high quality of power.

(3) Synchronization—NoIF supports clock management through circuits for multi-clock domains within the UDs.

(4) Processing capability—a processing core controls the main functions of each UD.

(5) Memory and queuing—embedded memory within each UD allows queue based communication and global signaling, as well as supporting local memory demands of the processing core.

(6) Testing—NoIF allows testing capabilities for the Si-IF, UDs, and functional dies (dies that are part of the functionality intended for the designed system).

(7) Redundancy allocation—UDs include additional circuit components to be used in case of failure of adjacent dies, increasing the overall reliability of the system.

Figure 5:
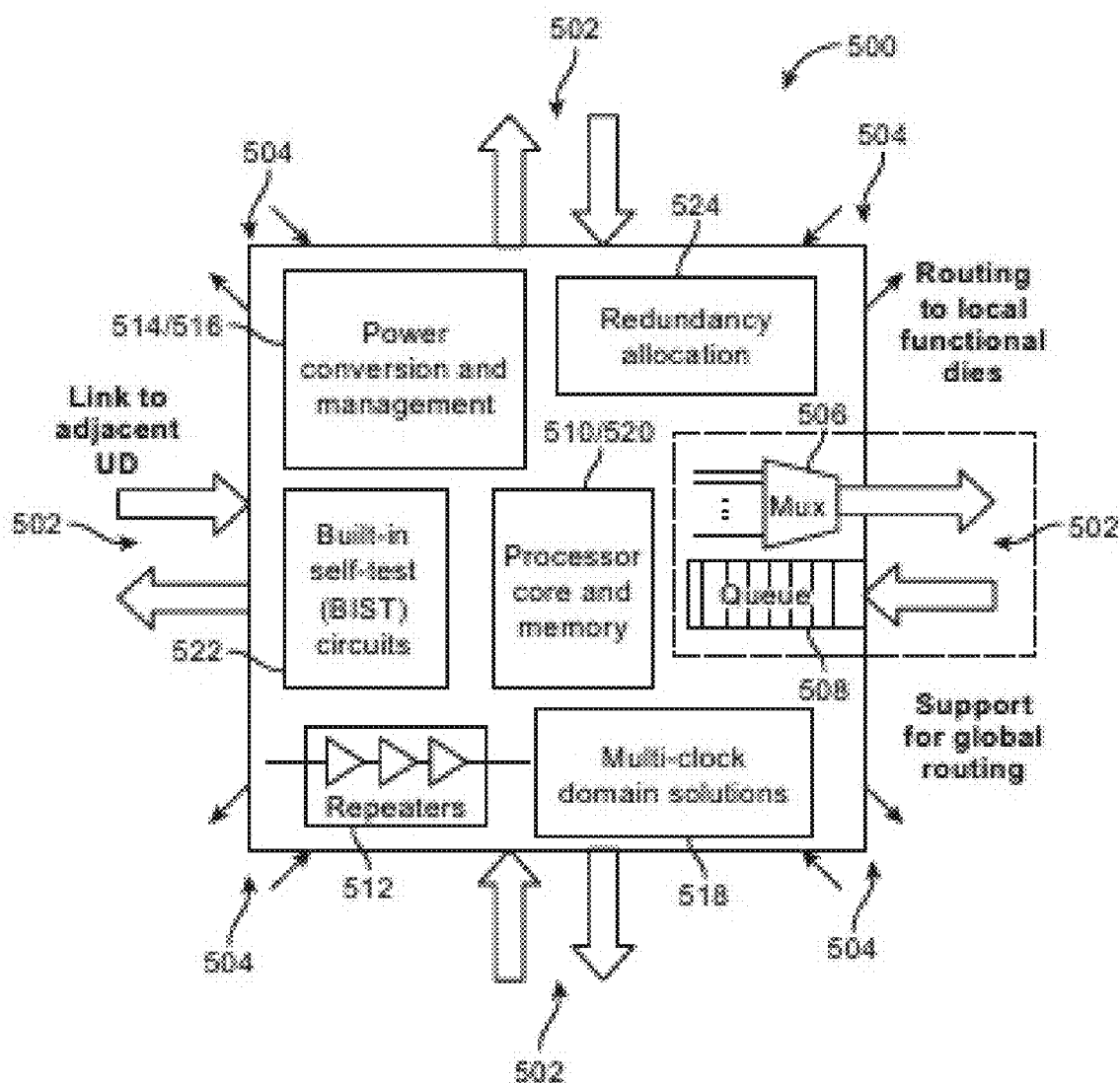
FIG. 5. Block-level schematic of a utility die within an NoIF.

To ensure feasibility and facilitate reuse of the NoIF, UDs of some embodiments are identical general purpose dies. The size, number, and floorplan of UDs within the Si-IF platform are design parameters that determine the capability of the NoIF versus the overhead that the network incurs. These parameters can affect the performance of the network for the aforementioned tasks. A conceptual block-level schematic of an UD 500 is shown in FIG. 5. Each UD 500 is connected by global interconnects (or links) 502 to adjacent UDs, and by local interconnects (or links) 504 to surrounding functional dies. Incoming data into the UD 500 (global and local) is queued to allow intelligent priority-based communication. The order of data at the output of the UD 500 (global and local) is determined according to priorities and routed using a set of multiplexers (MUXs) 506. Each UD 500 has a minimum area specification of, for example, about 0.25 mm$^2$ specified by the ability of a pick-and-place tool to pick and bond dies using TCB. UDs 500 are, therefore, able to support the circuit components described in FIG. 5.

IV. Architecture, Design, and Test of NoIF

A detailed discussion of the architecture, design, and testing methodologies of some embodiments is provided in this section. Certain concepts of communication within the NoIF are similar to NoC; however, the NoIF approach includes significant expansion on other system-level capabilities.

A. NoIF Architecture

The basic architecture of NoIF is based on UDs and wide global links that allow communication between adjacent UDs. Certain NoC communication procedures and architectures can be exploited to enhance the basic architecture. Each die within the Si-IF that is specified to communicate with another remotely placed die (not nearest neighbor) can utilize the NoIF. The minimal communication distance that can ensure that the utilization of NoIF is useful, depends on the delay and power associated with the communication of the signal. However, global routing congestion can specify utilization of the NoIF even when the benefit is not noticeable. According to the SuperCHIPS protocol for communication between dies within the Si-IF, significant benefits are exhibited for Si-IF links of length ≤about 500 µm, as compared to PCB and interposer technologies. Although these links are useful to connect dies to nearest neighbors, since dies can be placed as close as about 50 µm to about 100 µm within the Si-IF, communication over greater distances utilizes the NoIF.

B. Global and Semi-Global Routing

Global links are utilized to communicate between adjacent UDs. Incoming data can be placed in a set of buffers (e.g., input queues 508 shown in FIG. 5) and distributed to other UDs according to assigned priority. The priority of incoming data is determined by a processing core (e.g., a processing core 510 shown in FIG. 5) according to one or more of arrival time, urgency, and relevant link availability. In some cases, urgent data can be directed to a physically longer path that can provide a shorter temporal path. The management of the global routing is executed by the local processing core within each UD. The processing cores can communicate over the network to inquire about link availability and use this information to generate the shortest physical or temporal paths. A tradeoff between speed and power is considered by the processing core while generating the optimal path for the data.

Figure 6:
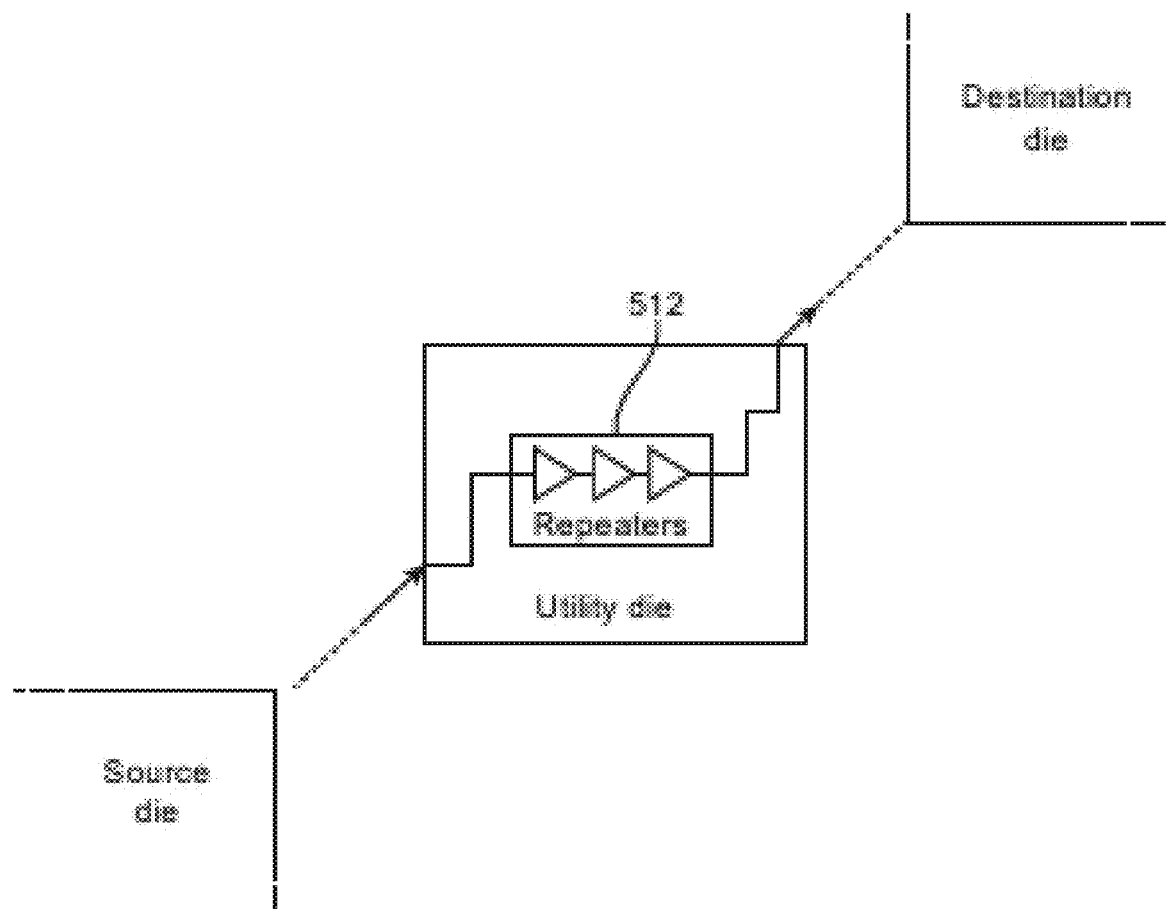
FIG. 6. Schematic of semi-global communication utilizing repeaters within a utility die.

In addition to communication with other UDs, a set of repeater circuits (e.g., repeater circuits 512 connected between the input queues 508 and the MUXs 506, as shown in FIG. 5) are included within each UD to support semi-global communication between dies that are not nearest neighbors. If a UD is located between two dies and is identified as the local NoIF node for both dies, the communication between the dies can be according to the SuperCHIPS protocol. The communication signal is then routed through the repeaters that are included within the UD to enhance the signal. A schematic of semi-global communication is depicted in FIG. 6.

Si-IF supports heterogeneous integration and is, therefore, compatible with optical interconnect (both waveguide-based and free-space). The power, area, and speed tradeoffs between electrical and optical communication can be considered when deciding to utilize optical interconnects. Optical interconnects can be beneficial for global communication across the entire Si-IF (e.g., >about 100 mm).

C. Power Regulation and Management

Since each UD is an integrated circuit (IC), a set of power regulation circuits (e.g., power regulation circuits 514 shown in FIG. 5) can be directly designed on the UD. The power to the Si-IF can be supplied via socket peripheral connectors (e.g., the connectors 406 shown in FIG. 4) for low power applications, or from a back side of the wafer using conductive posts for ultra-high power applications. For low power applications, the power can be supplied from the periphery of the wafer and distributed across the entire wafer. Small power conversions are possible on the Si-IF at the expense of area. The power is then locally regulated by power regulation circuits within the distributed UDs. Power regulation within each UD is performed using LDO regulators to ensure high quality of power according to the voltage specifications of adjacent dies (e.g., local voltage domains). In high power applications, the power is delivered at point-of-load voltage from the back side of the Si wafer directly to the UDs.

Delivering high quality power to devices within an ultra large scale system is a significant challenge. Moreover, heterogeneous integration imposes additional constraints on the delivered power—a variety of voltage domains, supply currents, and quality of power demands. To satisfy the power constraints of an ultra large scale heterogeneous system within the Si-IF, a set of power management circuits (e.g., power management circuits 516 shown in FIG. 5) is included.

Each node communicates particular power specifications to other nodes and the NoIF dynamically adapts the power regulation and delivery schemes to ensure high quality of power for each device, stability of the power system, and security.

Figure 7:
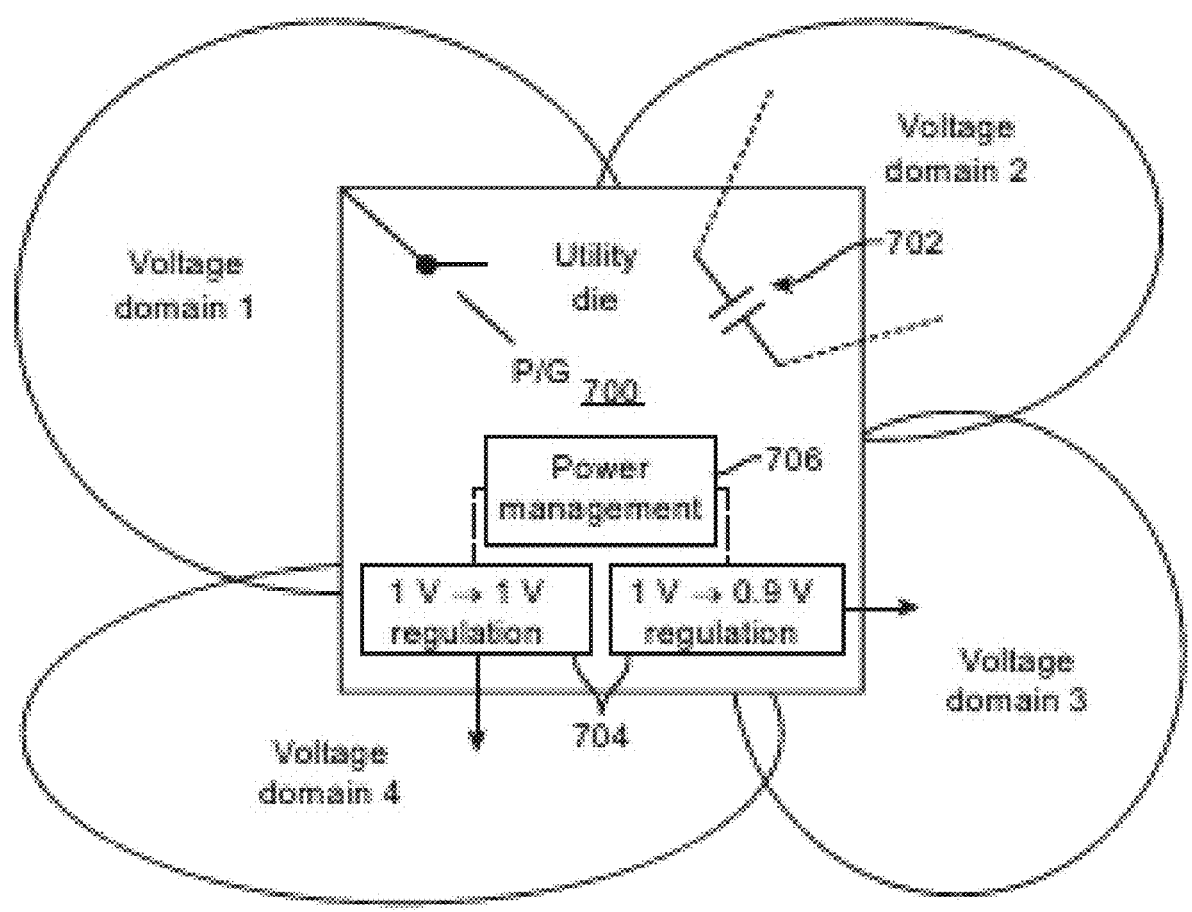
FIG. 7. Schematic of a utility die surrounded by multiple voltage domains. The utility die dynamically manages the regulation, gating, and stability of power delivered to adjacent dies. Decoupling capacitors are also included for passive frequency dependent power regulation.

Power-gating is also managed by the NoIF, as part of the power management scheme. Each UD is locally responsible to power-gate adjacent dies to conserve power when possible, by utilizing a power-gating (P/G) circuit 700 within the UD, as shown in FIG. 7. Decoupling capacitors (decaps) 702 are another power component within UDs that can be fabricated using Si processes such as deep trench technology. Multiple size decaps ensure that the Ldi/dt noise is within specifications for various frequencies of operation.

Power management considerations can drive system level floor planning and Si-IF resource allocation. A schematic of an UD within an NoIF surrounded by multiple voltage domains is shown in FIG. 7. A set of power regulation circuits 704 included in the UD receives power from the previous power distribution hierarchy, and supplies converted/regulated power to the local voltage domains having different voltage specifications. A power management circuit 706 is connected to the power regulation circuits 704, and adapts the power regulation and delivery schemes supplied to the local voltage domains by the power regulation circuits 704. The power management circuit 706 is also connected to the P/G circuit 700 and the decaps 702.

D. Synchronization

Clock distribution is a design consideration in synchronous ICs. Various synchronization methodologies are developed for SoCs and board level systems that can be adopted by the NoIF. For ultra large scale systems, a globally asynchronous locally synchronous (GALS) approach can be used. In this methodology, the communication between dies within the Si-IF is not clocked (e.g., using hand shake protocol); alternatively, local on-chip circuits are clocked. Adjacent dies within the Si-IF can also communicate synchronously using the SuperCHIPS communication protocol. GALS approach is especially beneficial for heterogeneous integration where different dies can utilize various clocks (multi-clock domains).

The proposed NoIF supports GALS by allowing asynchronous communication between UDs and local clock distribution, managed by clock circuits (e.g., clock circuits 518 shown in FIG. 5) on each UD. Similar to power gating, clock gating is also supported by the nodes within the NoIF.

Another approach is a wireless clock distribution across the entire wafer. In the wireless clock distribution approach, a transmitter circuit is incorporated with the Si-IF and a receiver circuit is included in each UD and/or each functional die. The UDs can manage the distributed clock, provide clock gating, and support multiple clock domains.

E. Processing Capability

A processing core (e.g., the processing core 510 shown in FIG. 5) provides processing capability to each UD. These cores (e.g., controllers) are responsible for the functionality of the UDs in terms of communication, power and clock management, and testing. Each processing core manages the traffic of data between local functional dies and adjacent UDs by controlling the queues and determining the priorities of incoming signals. Bypass routing is available for high priority data packets.

NoIF is effectively a many-core system that manages the communication within the Si-IF. In addition to communication, the processing cores support testing of the Si-IF, UDs, and functional dies, as described in Subsection IV-H.

F. Memory and Queuing

Queues (e.g., the input queues 508 shown in FIG. 5) are included to support access to mutual resource links between UDs. The incoming data from local dies is queued and arranged according to priorities determined by the processing core. Access to global links is managed by multiplexers (e.g., the MUXs 506 shown in FIG. 5), controlled by the processing core. Queue management architecture can be used.

A small embedded memory (e.g., a memory 520 shown in FIG. 5) is included to support the processing core and the NoIF. Network parameters and data are stored in this memory.

G. Floor Planning

Since UDs are dies placed within the Si-IF, it can be desired to optimize the physical location of each UD. A simulated annealing engine can be used to iteratively converge to an optimal solution considering a weight function. In addition to floor planning parameters such as area and interconnect length, the floor planning weight function of the NoIF includes parameters that are particular to the Si-IF technology. Example parameters that should be considered within the NoIF floor planning weight function include:

(1) Number of UDs—a parameter within the NoIF is the number of UDs. Each UD is an overhead, since the main function of the system is within the functional dies. The tradeoff between the overhead that each UD incurs and the benefit that it provides is quantified in terms of the area of each UD versus the area (or number of functional dies) it can effectively support.

(2) Voltage and clock domains—the number of voltage and clock domains can dictate both the number and placement of UDs. It can be desired to group functional dies with similar voltage or clock specifications to simplify the power/clock management for the UD.

(3) Heterogeneity of the system within the Si-IF—this parameter can affect the floorplan of the NoIF. A homogeneous system with regular dies will specify a similarly regular NoIF. Alternatively, a heterogeneous system, composed of disparate size and aspect ratio dies, can specify a particular NoIF floorplan. A hybrid NoIF is also possible, where part of the system is homogeneous and another part is heterogeneous. The floorplan of the UDs can exhibit similar properties.

(4) Area—since the areas and aspect ratios of UDs are substantially identical, the area of the entire floorplan (including functional dies) can be considered while iterating the placement of the UDs. The locations of the UDs can affect placement of functional dies.

(5) Interconnect length—two types of interconnects can be considered (a) global links between UDs, and (b) local interconnects between functional dies and closest UD. Note that functional dies can be assigned (e.g., connected) to multiple UDs and processing cores can determine the optimal routing path in real time.

(6) Heat dissipation—this issue is alleviated by the Si-IF technology as compared to, for example, three-dimensional (3-D) ICs, due to the high thermal conductance of a silicon substrate. The Si-IF spreads the heat effectively across the entire wafer. Nonetheless, additional thermally-aware floor planning techniques can be included to separate thermally aggressive dies from thermally sensitive dies.

Figure 8:
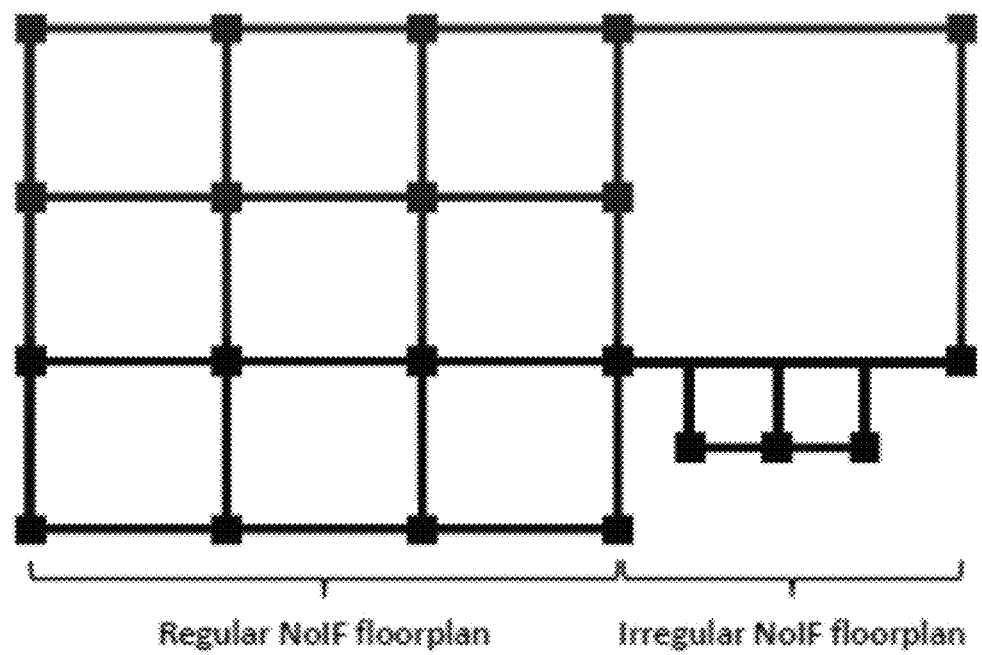
FIG. 8. An example NoIF floorplan compatible with both homogeneous and heterogeneous systems that coexist within a single Si-IF platform.

The NoIF can exhibit an irregular floorplan based on the specifications of the system within the Si-IF. An example NoIF floorplan adapted for heterogeneous and homogeneous systems within a single Si-IF is shown in FIG. 8.

H. Testing

Although Si-IF can employ mature Si processing technologies, failure can happen during fabrication of the Si-IF or during the TCB process. In addition, functional bare dies can also exhibit failure during fabrication and handling. Testing of the overall system and individual components within the system is desired to reduce failure and enhance yield. Built-in self-test (BIST) procedures and compatible circuits are designed into the UDs (e.g., BIST circuits 522 shown in FIG. 5). The BIST approach allows a system to perform self-testing according to predefined inputs and expected outputs.

The NoIF supports testing on both the system and component level. After placing the UDs on the Si-IF, communication signals are used to test the bonding (pillars), interconnect fabric, and the UD itself. The network can effectively gather information regarding itself and the Si-IF platform on which it is designed. UD failures are recorded by all other UDs to update the constraints of the routing procedures. In addition, defective interconnect fabric is identified and bypass routes are determined. Once the Si-IF and UDs have been tested, the functional dies are placed. Note, the test results of the Si-IF and UDs can affect the placement of functional dies. For example, if a certain UD is defective, functional dies can be placed closer to other functional UDs. After the functional dies are bonded, BIST procedures are executed to identify defects within the functional dies and redundancy allocation (RA) is performed.

I. Redundancy Allocation

The BIST circuits (described in IV-H) are capable of identifying failures; however, RA is performed to correct for failures (e.g., by RA circuits 524 shown in FIG. 5). Together, BIST and RA provide a built-in self-test and repair (BISTR) capability. Two levels of RA are supported by the NoIF of some embodiments. At the circuit level, additional circuits are available within the UD to accommodate circuit failure. These additional circuits can be used as backup for circuits in the UD or in functional dies. However, bypassing local circuits on a functional die by communicating with an UD should be performed in extreme cases. At the system level, the UDs can store information regarding the functionality of other UDs and functional dies in an embedded nonvolatile memory, such as one-time-programmable-memory/multi-time-programmable-memory (OTPM/MTPM). A certain die can fail either during processing (fabrication and bonding) or during operation. In either case, failures are detected by the UD and the information is stored to adapt routing procedures and other functionality of the UD, such as cut off power to the malfunctioning die to conserve power.

RA is a desired capability within the Si-IF since rework of dies (e.g., replacement of bonded dies after identified failure) is generally not performed. Rigorous testing should, therefore, be performed prior to bonding dies to the Si-IF to mitigate against reduction in performance of the overall system.

V. Proposed Structure for Antenna Integration in Si-IF

Figure 9:
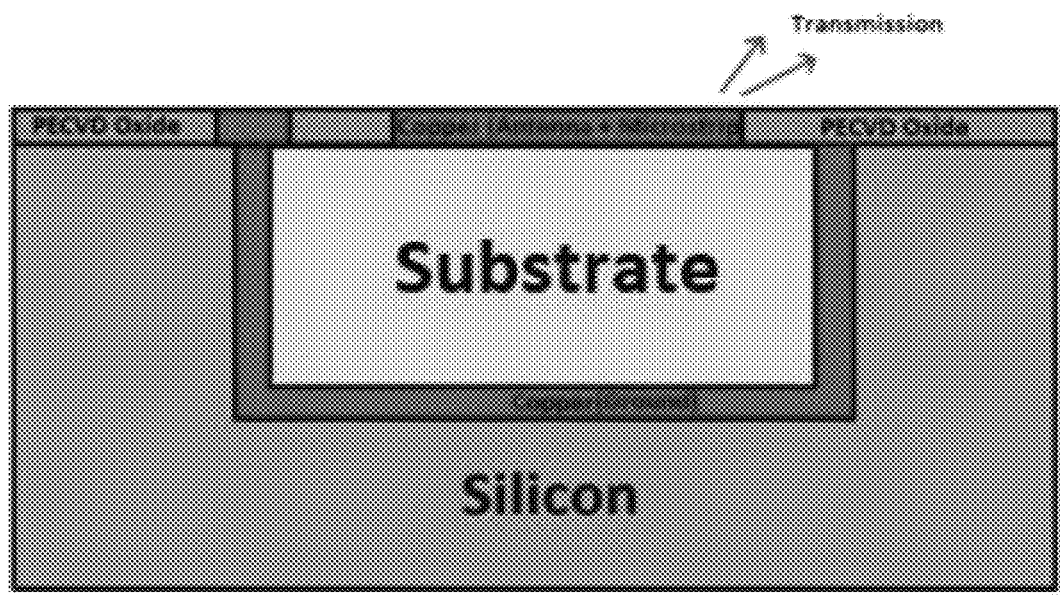
FIG. 9. Structure of antenna integrated in Si-IF.

An antenna is integrated as part of the Si-IF itself (Antenna of IF). The silicon is recessed to be replaced with the antenna substrate. FIG. 9 illustrates one example structure. As seen from the figure, the ground plane and the antenna are isolated from each other in this structure. For the antenna design, implemented is a patch antenna for its ease of fabrication and design. Keysight ADS can be used to design the antenna for both Fused Silica and PDMS substrate. The specifications used to design the antenna are given in table II.

TABLE II

| Dielectric thickness | 300 μm | |
| Frequency of Operation | 20 GHz | |
| Material Properties | Fused Silica | PDMS |
| Dielectric constant | 3.9 | 2.7 |
| Loss tangent | 0.0002 | 0.046 |

Figure 10A:
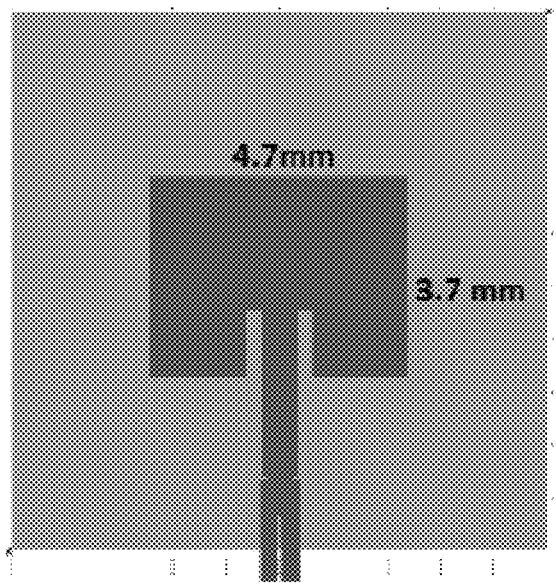
FIGS. 10A and 10B show example final designs of the patch antennas for the fused silica and PDMS embodiments of the present application, respectively.
Figure 10B:
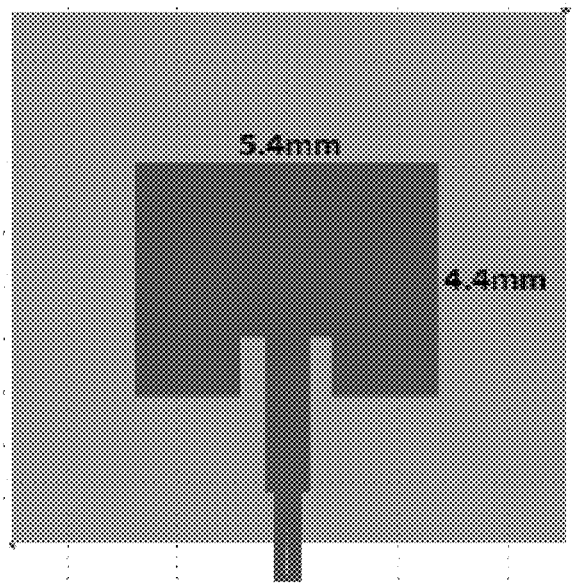
Figure 11:
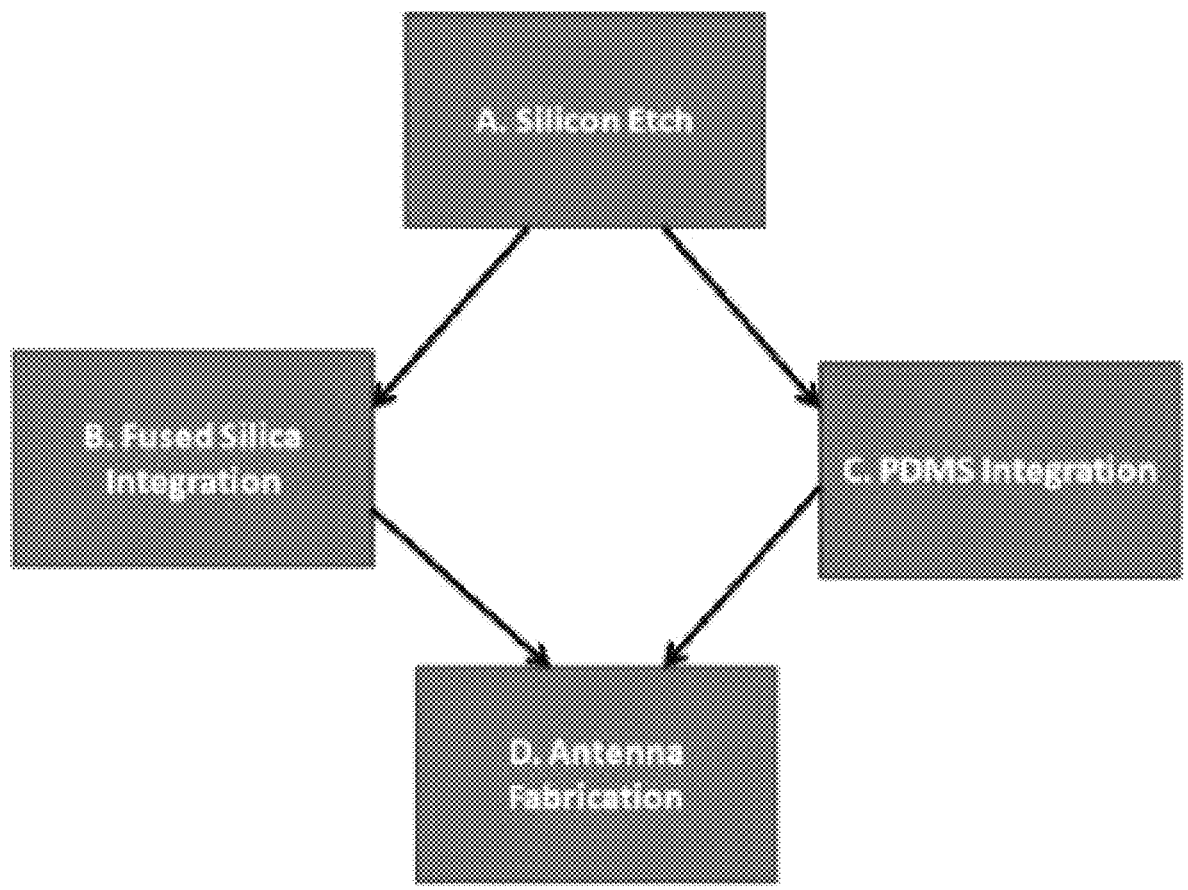
FIG. 11 shows the general outline of an antenna integration on Si-IF according to embodiments.

FIGS. 10A and 10B show example final designs of the patch antennas for the fused silica and PDMS embodiments of the present application, respectively. FIG. 11 shows the general outline of an antenna integration on Si-IF according to embodiments. First, the silicon substrate is etched down to 300 m which is described in part A. Subsequently, the process flow splits into two parts B and C, which describes the two alternative processes to integrate fused silica substrate and PDMS substrate respectively. Once the substrates are successfully integrated, the antenna is fabricated using the semi-additive process which is described in part D.

A. Silicon Etch Process Flow

Figure 12:
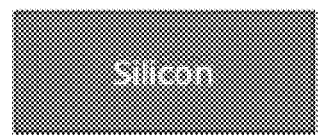
FIG. 12 shows the first part of an example silicon etch process.
Figure 12:
Figure 12:
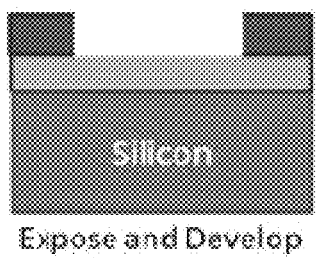
Figure 12:
Figure 12:
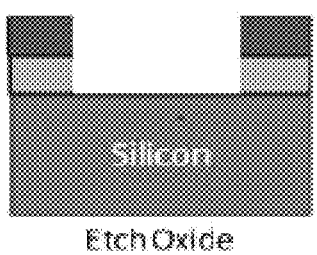
Figure 12:
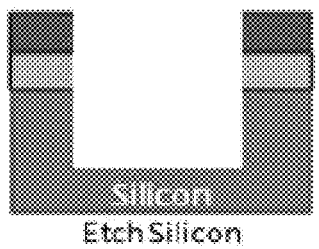
Figure 13:
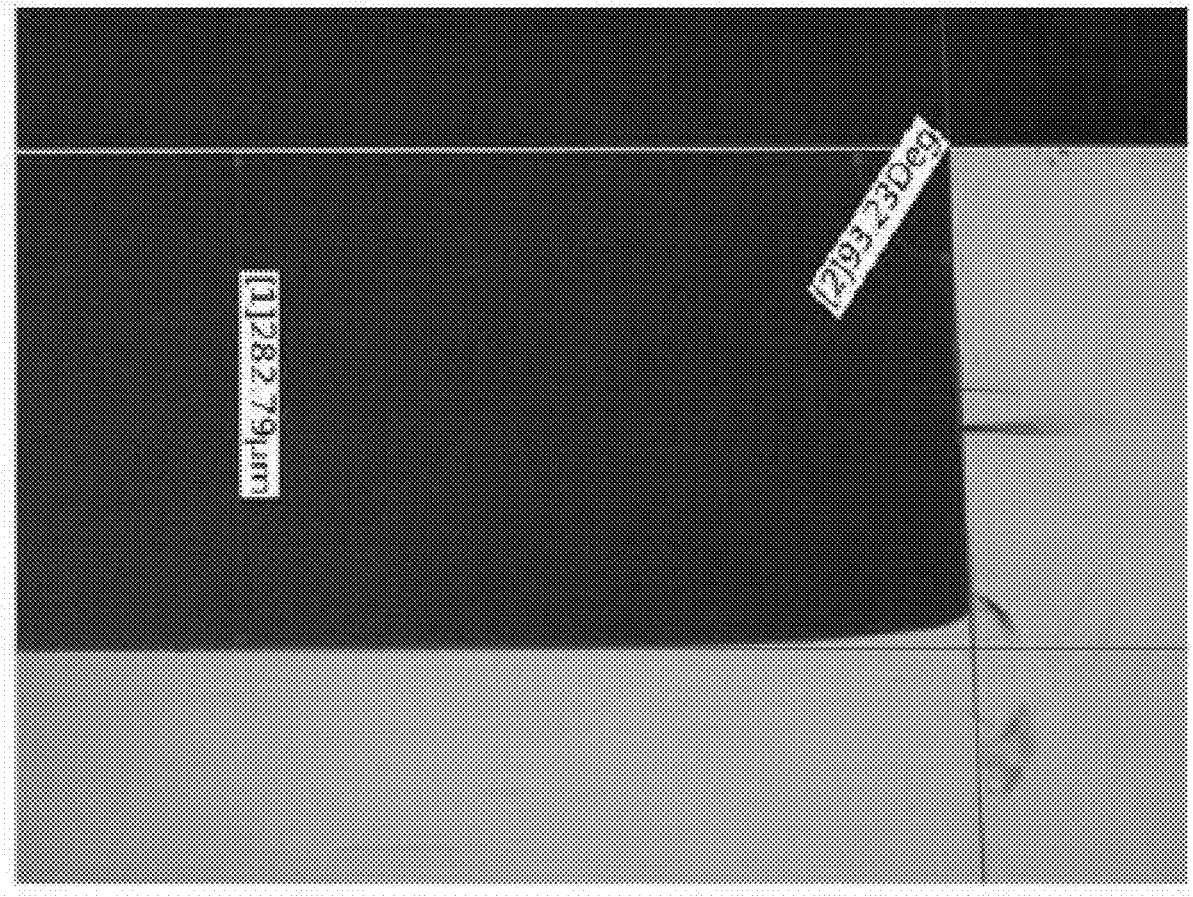
FIG. 13 shows the cross sectional view of the recess.

As shown in FIG. 12, the first part of an example process 1200 according to embodiments is etching down the silicon up to the required depth. First, the silicon substrate is treated in hydroflouric acid (HF) and piranha to clean the wafer. The wafer is then thermally oxidized to 3 m of silicon dioxide using the Tystar Mini-3600 Oxidation chamber at 1100° C. for 30 hours. This oxide layer will act as a hard mask for the silicon etch. Then the AZ5214E photoresist was spin coated at 2000 rpm over the substrate, which was exposed for 10 seconds using the Karl Suss Mask Aligner. The oxide hard mask was then etched down using dry etching. The patterned hard mask was finally used to etch down the Silicon using Bosch etch process, which was done using the Plasma-Therm FDRIE DSE II silicon plasma etcher for about 40 minutes. Consequently, the wafers were cleaned with acetone and then HF to remove the photoresist and the oxide layer. The Bosch etch process has been optimized to produce excellent trench profiles with a total thickness variation of 2.5 μm. FIG. 13 shows the cross sectional view of the recess. A retrograde profile is observed with an average tapering of 2.42 degrees, with the etch depth variation across the wafer being 292.35±5.98 μm. Sections B and C describes two alternative process flows.

B. Fused Silica Substrate Integration Process

Figure 14:
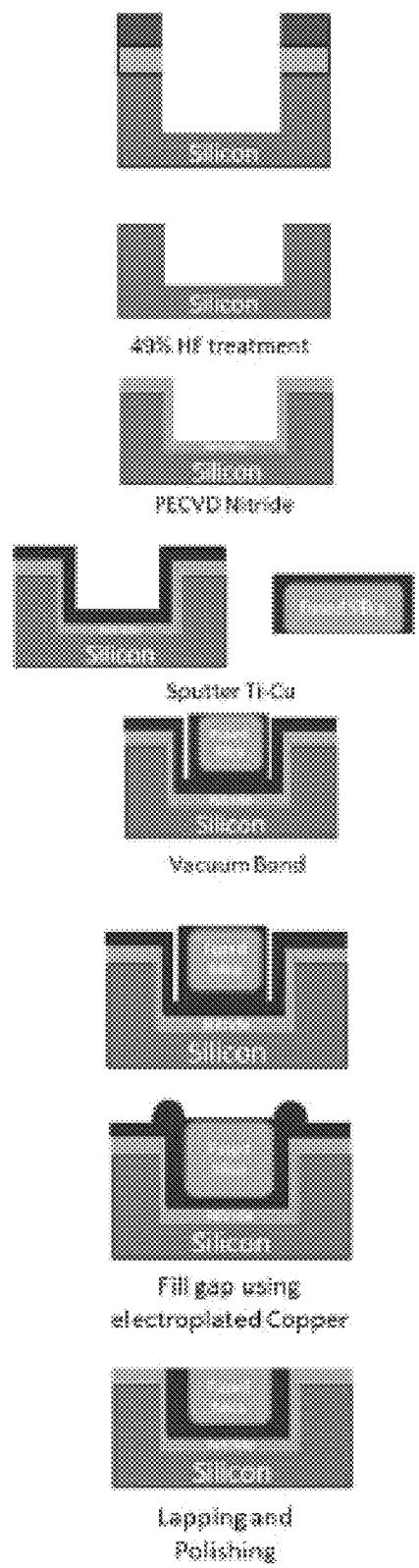
FIG. 14 shows an example process flow for fused silica embodiments.
Figure 15:
FIG. 15 shows one example of a vacuum bonding chamber that can be used in embodiments.
Figure 16:
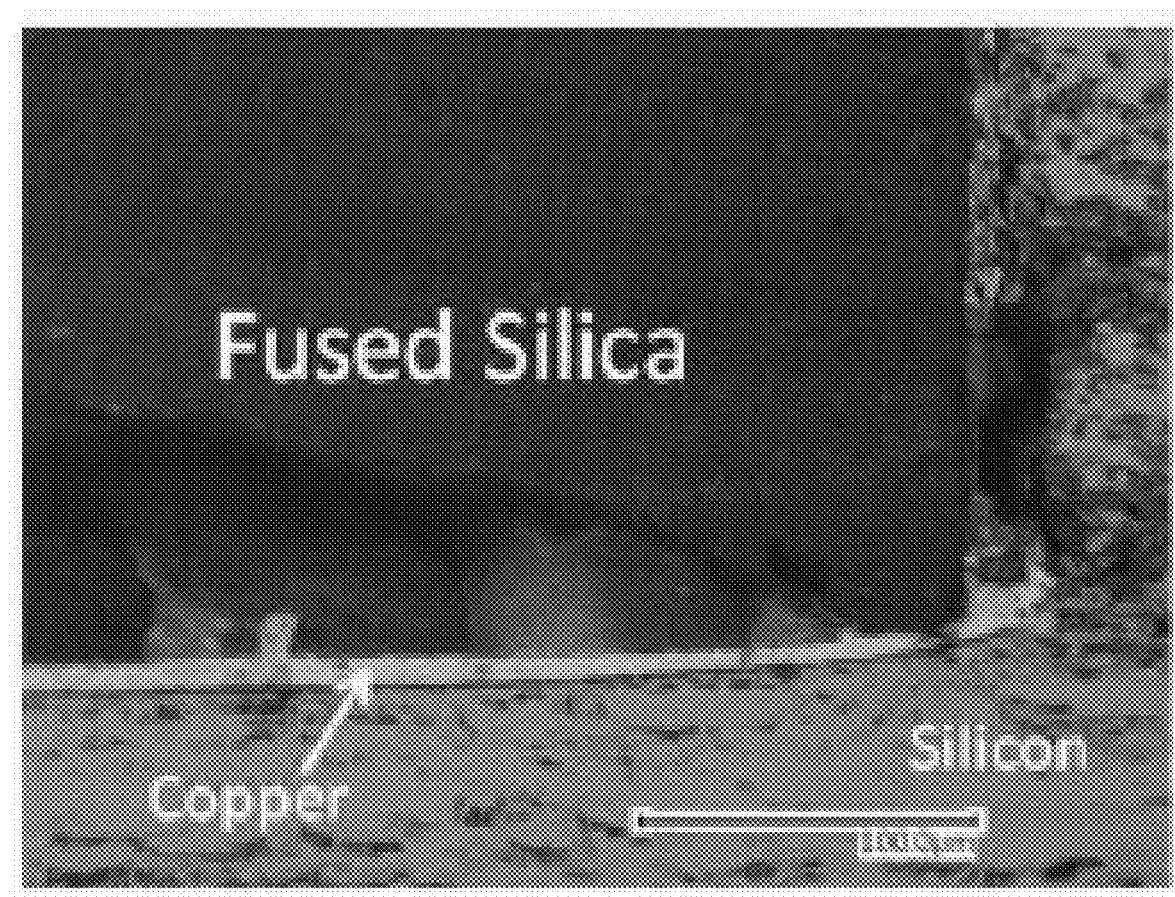
FIG. 16 shows the bonded interface between the fused silica die and silicon.

As shown in FIG. 14, the silicon wafer is oxidized and coated with nitride using CVD deposition system which is to be used as a polish stop for later processing. Both the Silicon Wafer and the Fused Silica die of size 10 mm×10 mm is sputtered with Titanium/Copper (20 nm/200 nm). The die is then bonded to the recessed silicon wafer using copper-copper vacuum thermal compression bonding (TCB). FIG. 15 shows one example of a vacuum bonding chamber that can be used in embodiments. Before the samples are loaded into the chamber, they are treated with acetic acid. The samples were bonded at 280° C. at 10-4 torr for 20 minutes with pressure added using 20 kg weight. The microgap between the die and the wafer is then filled with electroplated copper. The resulting overburden is then polished off for planarisation. The antenna can now be designed and fabricated on top of this platform. FIG. 16 shows the bonded interface between the fused silica die and silicon.

C. PDMS Substrate Integration Process

Figure 17:
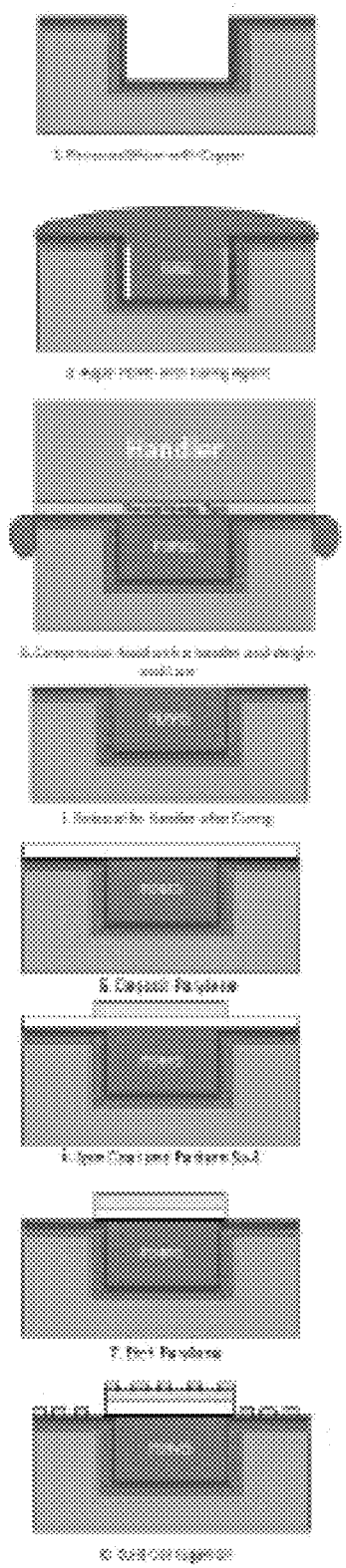
FIG. 17 is an example process flow for PDMS embodiments.
Figure 18:
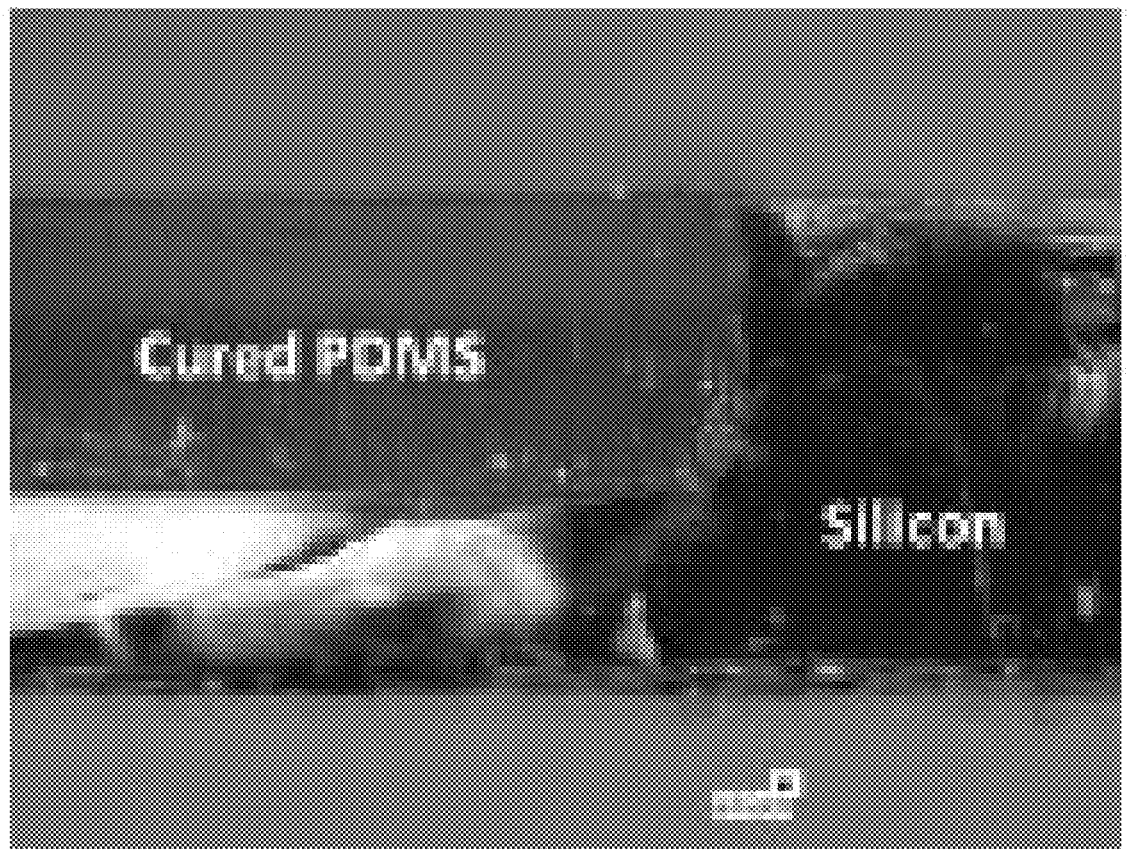
FIG. 18 illustrates an example compression molding result.

As shown in FIG. 17, the PDMS is first mixed with a curing agent and then dispersed over the recessed Silicon. Using the Handler wafer along with thermal release tape, the PDMS is compression molded over the silicon recess. The PDMS is then cured at 25° C. The compression molding result has been shown in FIG. 18. Once the PDMS is cured, the handler is released by heating the tape at 120° C. After release, 1 m of Parylene-C and 1 m of SU-8 is coated on top of the substrate which acts as a stress buffer. The SU-8 is patterned in a corrugated manner to prevent metal lines from cracking during processing. The antenna is then fabricated on the cured PDMS.

D. Antenna Fabrication Process

Figure 19:
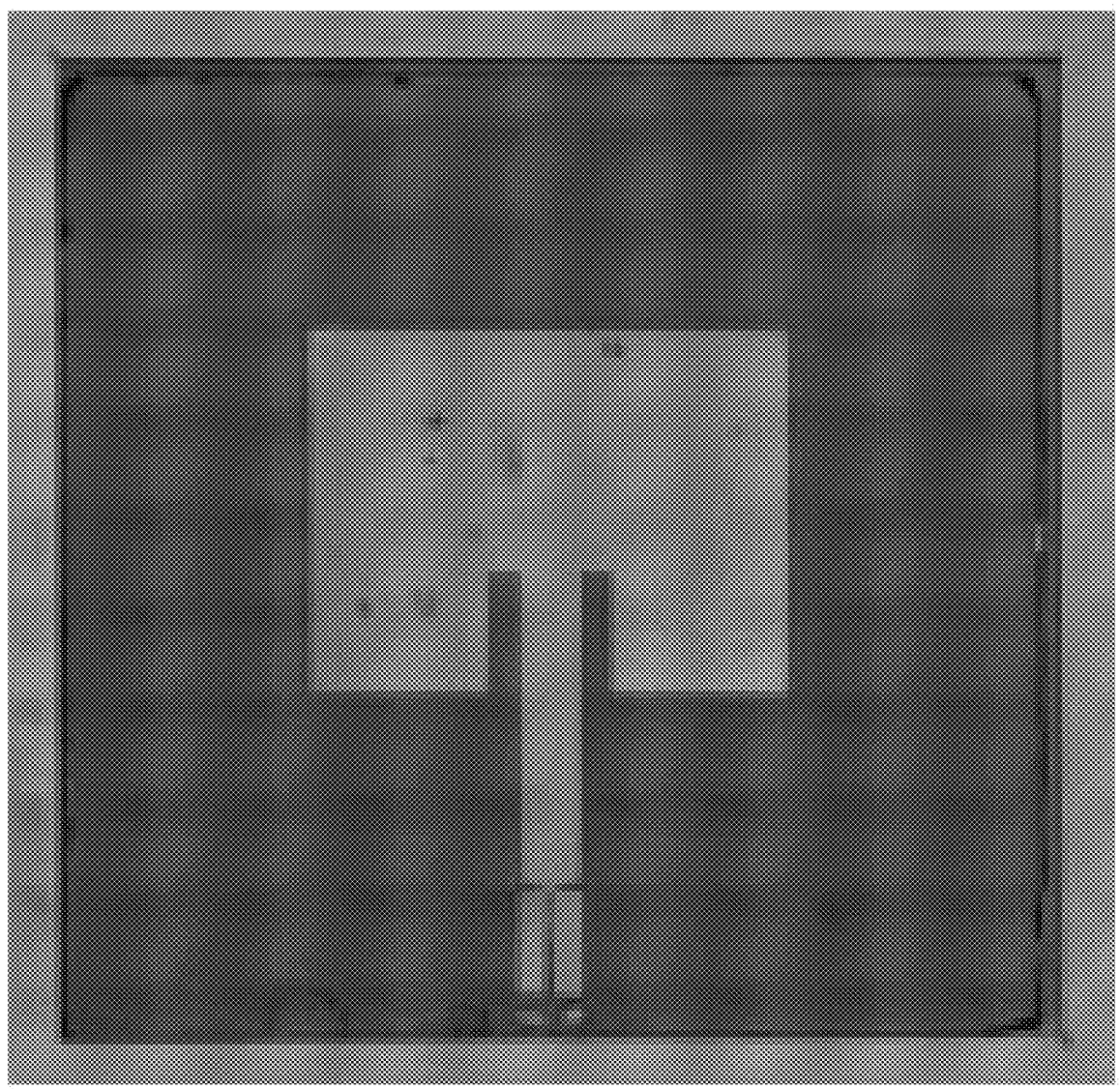
FIG. 19 illustrates the result of the semi-additive printing of the miniaturised antenna on an embedded Fused Silica die.
Figure 20:
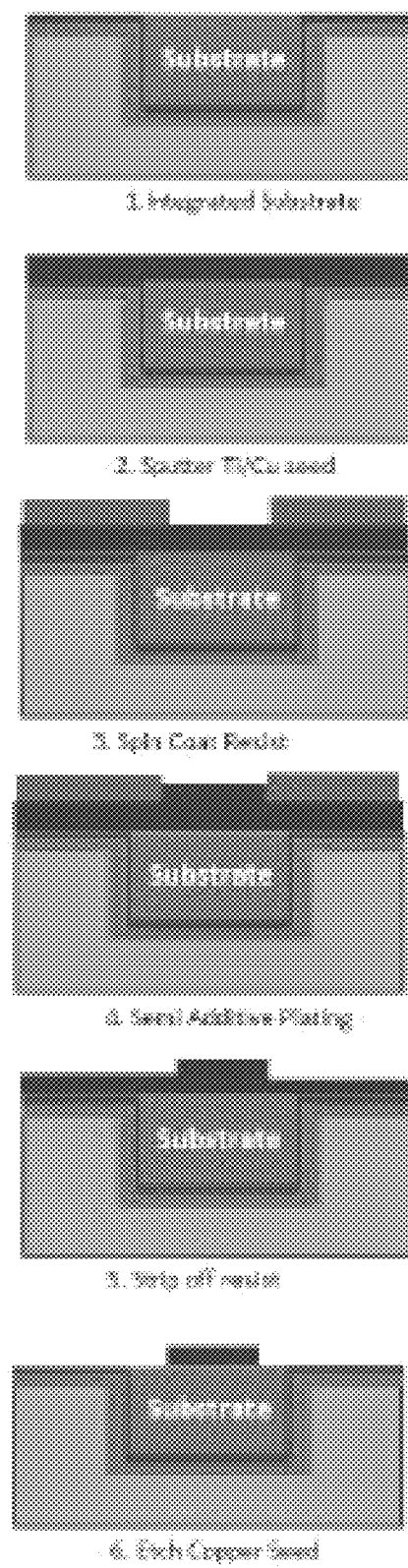
FIG. 20 illustrates, for antenna fabrication, an example of how a semi-additive process is adopted.
Figure 21:
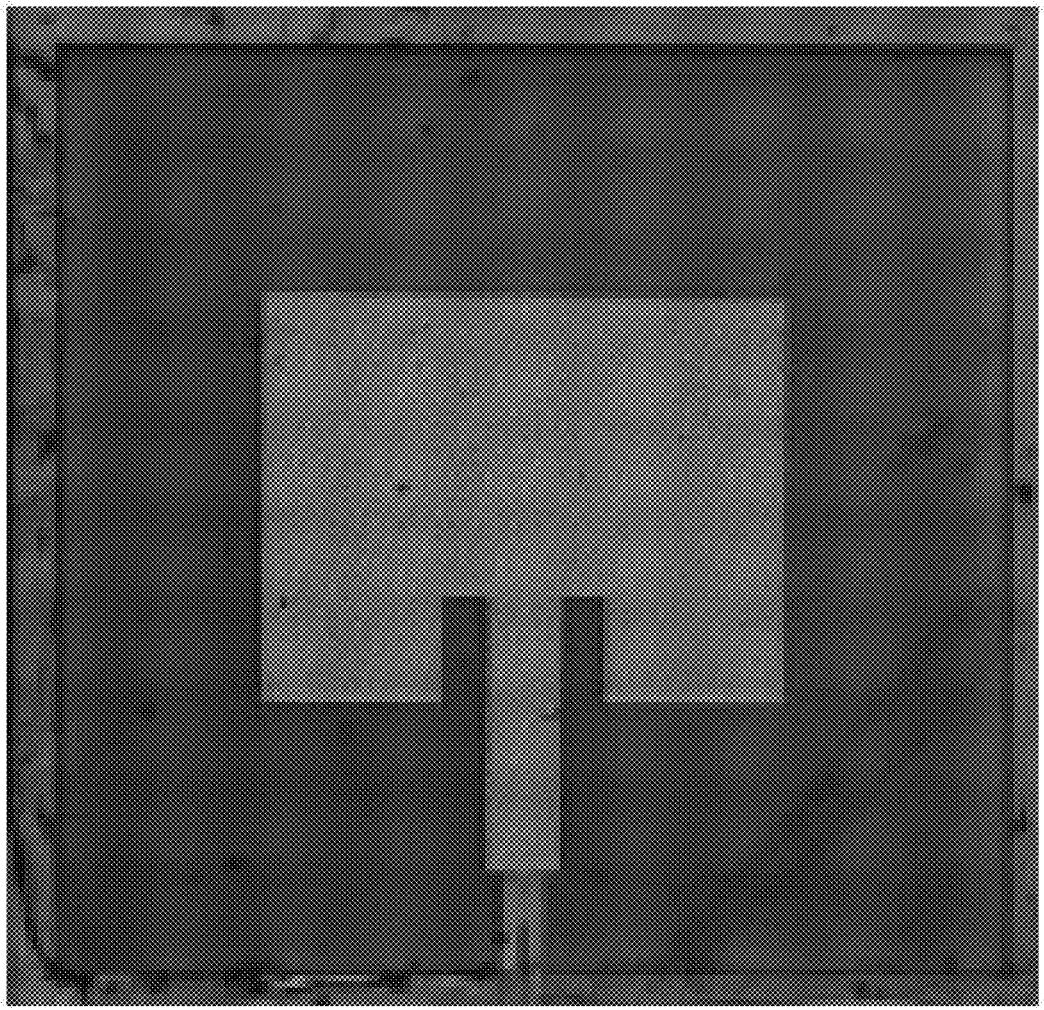
FIG. 21 demonstrates the fabricated antenna on top of compression molded PDMS.

As shown in FIG. 20, for antenna fabrication, a semi-additive process is adopted. The integrated antenna substrate is first sputtered with Titanium/Copper (20 nm/200 nm). Positive photoresist is spincoated and developed using the antenna pattern described in FIGS. 10A and 10B. The exposed copper seed is then electroplated up to 1 m. The resist is stripped off using acetone. Finally the seed layer is etched away using Ammonium Per Sulphate (APS) Copper Etchant solution. FIG. 19 illustrates the result of the semi-additive printing of the miniaturised antenna on an embedded Fused Silica die. FIG. 21 demonstrates the fabricated antenna on top of compression molded PDMS. The corrugation pattern can be observed on the sample. This helps to prevent metal buckling and cracking during processing, because of enormous Coefficient of Thermal Expansion (CTE) mismatch between the metal and PDMS.

E. Results and Discussion

Figure 22:
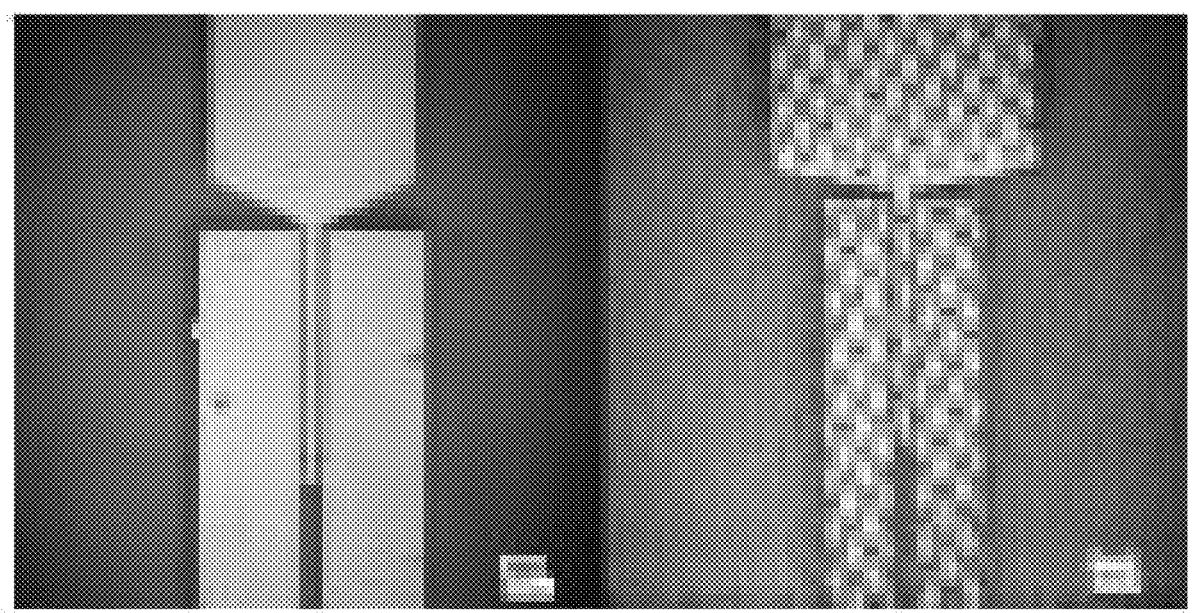
FIG. 22 demonstrates the fabricated probe pads for the two substrates (fused silica on the left, PDMS on the right).
Figure 23:
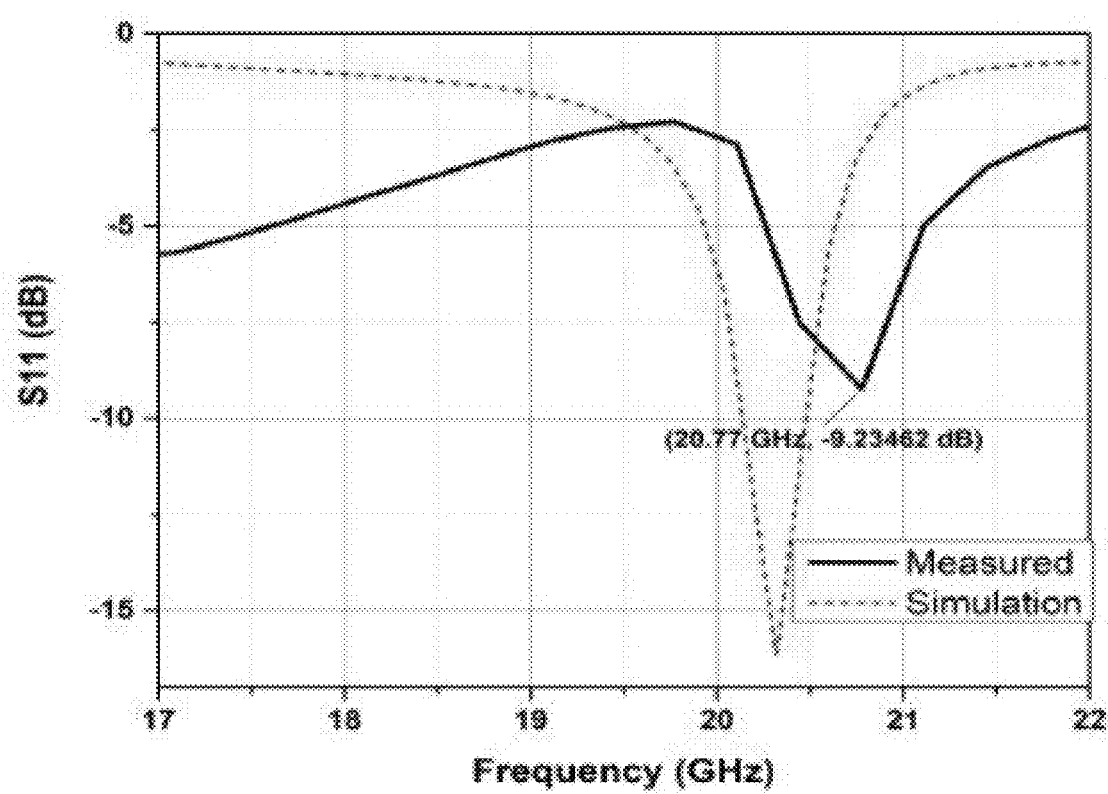
FIGS. 23 and 24 illustrate the simulated and measured antenna characteristics, respectively.
Figure 24:
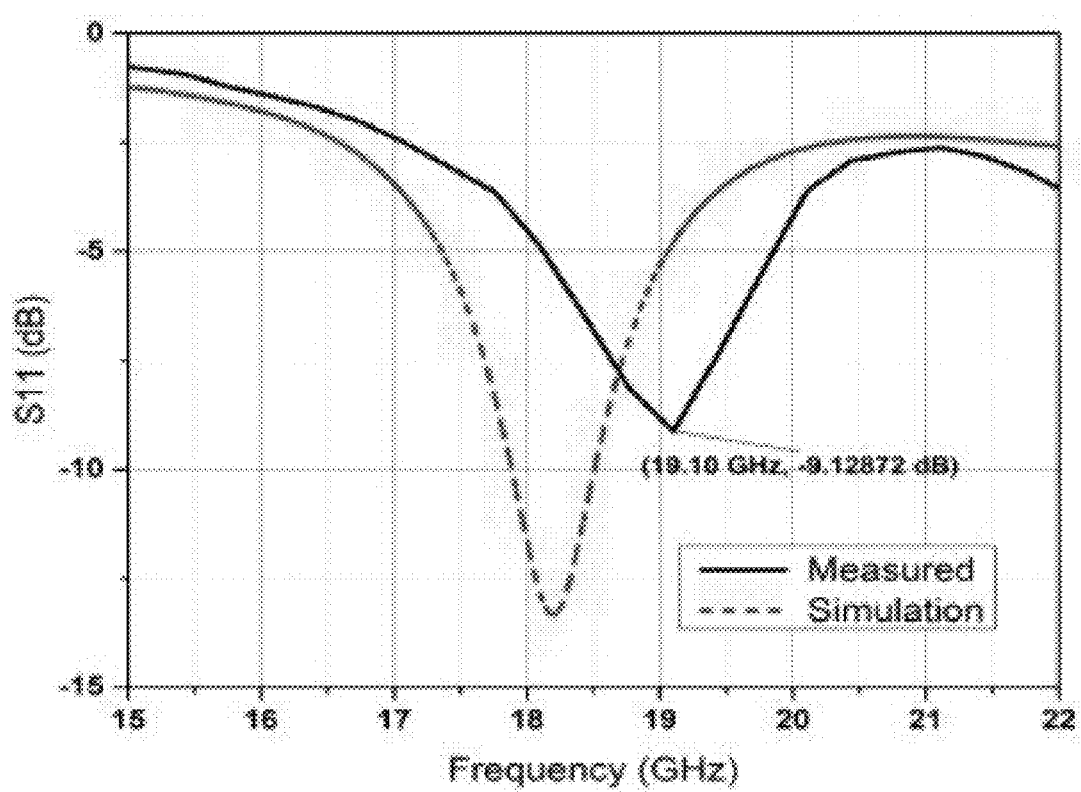
Figure 25:
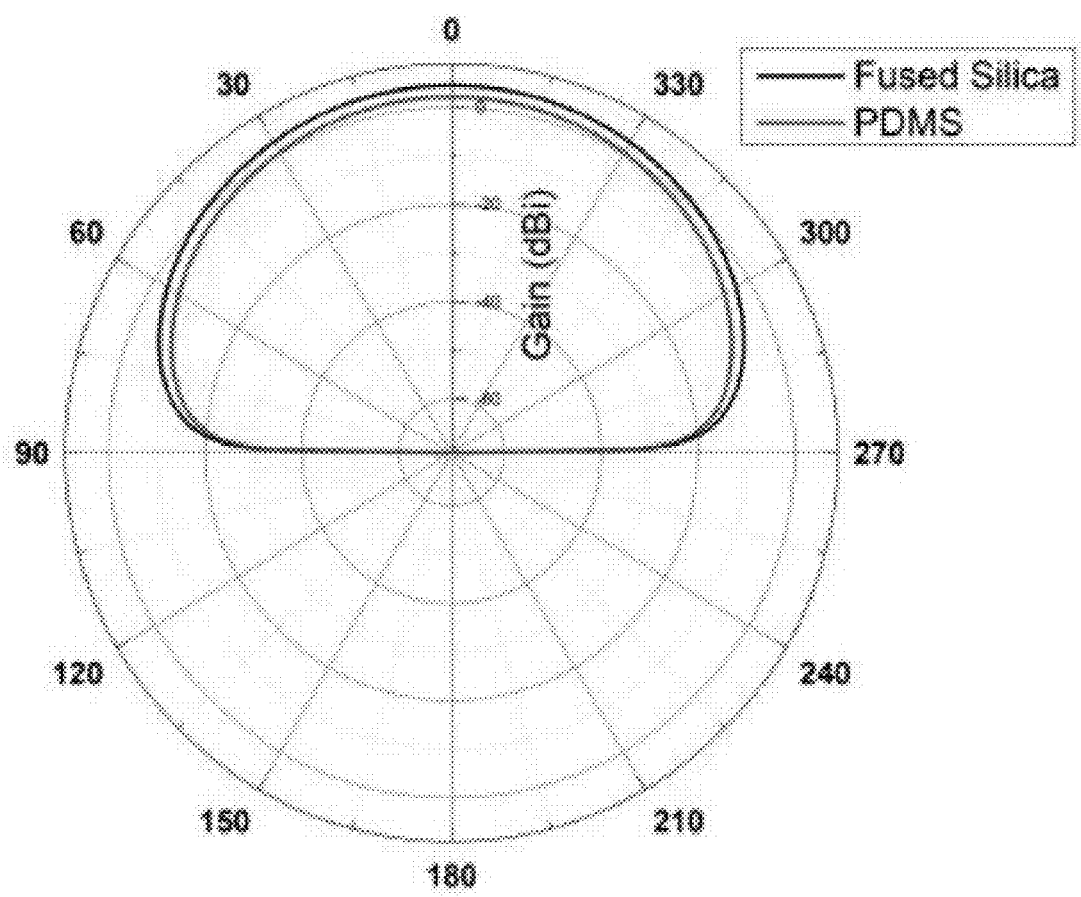
FIG. 25 compares the simulated radiation pattern for both antennas.

The fabricated antennas were tested for return loss. To test the S11 performance of the antenna, a microstrip to co-planar waveguide transition was designed to enable ground-signalground probing. FIG. 22 demonstrates the fabricated probe pads for the two substrates (fused silica on the left, PDMS on the right). The simulated and measured antenna characteristics are demonstrated in FIGS. 23 and 24. The disparities between the simulated and measured resonant frequencies is 450 MHz for Fused Silica and 840 MHz for PDMS. This can be attributed to a finite ground plane, and copper thickness which is 1 m for the current prototype. For antenna design on the PDMS substrate, the impact of SU-8 corrugations on the S11 performance has not yet been tested and is a subject for further exploration. The embedded fused silica antenna is shown to resonate at 20.77 GHz with an S11 of −9.23 dB whereas the compression molded PDMS antenna resonates at 19.10 GHz with an S11 of −9.12 dB. FIG. 25 compares the simulated radiation pattern for both antennas. The antenna on the Fused Silica substrate demonstrates a higher gain of 4.45 dBi with an efficiency of 67.95%, whereas the one on PDMS has a gain of 2.14 dBi with an efficiency of 31.86%.

VI. Conclusions

The Si-IF platform is enhanced for integration of ultra large scale heterogeneous systems. An NoIF is proposed in this disclosure to provide high performance of the integrated systems. The NoIF is based on intelligent UDs that incorporate active circuits to provide services for a wide variety of architectures, designs, and testing aspects. The UDs are robust in terms of the services they are able to support within the NoIF. The network can provide global communication, as well as power and clock management, processing and embedded memory, RA, and BIST capabilities. A variety of heterogeneous and ultra large scale applications can benefit from the Si-IF technology.

Additionally presented are two viable ways to implement an antenna on the Silicon-Interconnect Fabric with both processes showing promising results. Post-fabrication, the embedded fused silica antenna is shown to resonate at 20.77 GHz with an S11 of −9.23 dB whereas the compression molded PDMS antenna resonates at 19.10 GHz with an S11 of −9.12 dB. With further optimisation and testing, the antennas are expected to provide much better performance given the superior material properties of Fused Silica and PDMS compared to silicon. The process described herein can also be adapted to replace onchip antennas, which have always been lossy due to the limitation introduced by silicon's high dielectric constant. It is expected to adapt these processes to integrate 60 GHz antennas on the Si-IF to make it compatible with 5G applications and also extend this approach to C and D bands.

VII. Example Embodiments

First Aspect

In some embodiments according to a first aspect, a system for interconnecting a plurality of functional dies on a single substrate includes: (1) multiple global links on or within or otherwise included in the substrate; (2) multiple local links on or within or otherwise included in the substrate; and (3) multiple utility dies on the substrate, wherein each of the utility dies is connected to at least one of the global links, the utility dies are configured to communicate with one another through the global links, each of the utility dies is connected to at least one of the local links and is configured to communicate with at least one of the functional dies through the at least one of the local links.

In some embodiments, each of the utility dies includes an input queue to receive incoming data from one or more of the global links and one or more of the local links, and includes a multiplexer to provide outgoing data to one or more of the global links and one or more of the local links. In some embodiments, each of the utility dies includes a processing core configured to direct operation of the input queue and the multiplexer to route incoming data received by the input queue to a selected link through the multiplexer. In some embodiments, the processing core is configured to route the incoming data to the selected link through the multiplexer according to a priority assigned to the incoming data.

In some embodiments, each of the utility dies includes a set of repeater circuits connected between the input queue and the multiplexer. In some embodiments, the processing core is configured to route incoming data received by the input queue to the multiplexer via the set of repeater circuits. In some embodiments, the incoming data is received from a source functional die connected to the input queue, and the processing core is configured to route the incoming data to a destination functional die connected to the multiplexer.

In some embodiments, each of the utility dies includes a power regulation circuit configured to regulate a received voltage to a local voltage to be supplied to at least one of the functional dies disposed adjacent to the utility die. In some embodiments, each of the utility dies includes a power management circuit connected to the power regulation circuit. In some embodiments, each of the utility dies includes multiple power regulation circuits to supply respective, different local voltages, and the power management circuit is connected to the power regulation circuits. In some embodiments, each of the utility dies includes a power-gating circuit connected to the power management circuit. In some embodiments, each of the utility dies includes a decoupling capacitor connected to the power management circuit.

In some embodiments, each of the utility dies includes a clock circuit configured to generate a local clock signal to be supplied to at least one of the functional dies disposed adjacent to the utility die. In some embodiments, each of the utility dies includes a plurality of clock circuits to supply respective, different local clock signals.

In some embodiments, each of the utility dies includes a built-in self-test circuit configured to perform tests of the system.

In some embodiments, the utility dies are configured to perform redundancy allocation in an event of a failure of one of the utility dies or one of the functional dies.

Second Aspect

In some embodiments according to a second aspect, a system includes: (1) a single substrate to accommodate multiple functional dies on the substrate, wherein the substrate includes: (a) multiple global links in the substrate, and (b) multiple local links in the substrate; and (2) multiple utility dies on the substrate, wherein each of the utility dies is connected to at least one of the global links, the utility dies are configured to communicate with one another through the global links, each of the utility dies is connected to at least one of the local links and is configured to communicate with at least one of the functional dies through the at least one of the local links.

In some embodiments, the substrate is a silicon substrate.

In some embodiments, each of the utility dies includes an input queue to receive incoming data from one or more of the global links and one or more of the local links, and includes a multiplexer to provide outgoing data to one or more of the global links and one or more of the local links. In some embodiments, each of the utility dies includes a processing core configured to direct operation of the input queue and the multiplexer to route incoming data received by the input queue to a selected link through the multiplexer. In some embodiments, the processing core is configured to route the incoming data to the selected link through the multiplexer according to a priority assigned to the incoming data.

In some embodiments, each of the utility dies includes a set of repeater circuits connected between the input queue and the multiplexer. In some embodiments, the processing core is configured to route incoming data received by the input queue to the multiplexer via the set of repeater circuits. In some embodiments, the incoming data is received from a source functional die connected to the input queue, and the processing core is configured to route the incoming data to a destination functional die connected to the multiplexer.

In some embodiments, each of the utility dies includes a power regulation circuit configured to regulate a received voltage to a local voltage to be supplied to at least one of the functional dies disposed adjacent to the utility die. In some embodiments, each of the utility dies includes a power management circuit connected to the power regulation circuit. In some embodiments, each of the utility dies includes multiple power regulation circuits to supply respective, different local voltages, and the power management circuit is connected to the power regulation circuits. In some embodiments, each of the utility dies includes a power-gating circuit connected to the power management circuit. In some embodiments, each of the utility dies includes a decoupling capacitor connected to the power management circuit.

In some embodiments, each of the utility dies includes a clock circuit configured to generate a local clock signal to be supplied to at least one of the functional dies disposed adjacent to the utility die. In some embodiments, each of the utility dies includes a plurality of clock circuits to supply respective, different local clock signals.

In some embodiments, each of the utility dies includes a built-in self-test circuit configured to perform tests of the system.

In some embodiments, the utility dies are configured to perform redundancy allocation in an event of a failure of one of the utility dies or one of the functional dies.

Third Aspect

In some embodiments according to a third aspect, a system for interconnecting a plurality of functional dies on a single substrate includes: (1) multiple global links on or within or otherwise included in the substrate; (2) multiple local links on or within or otherwise included in the substrate; (3) multiple utility dies on the substrate, wherein each of the utility dies is connected to at least one of the global links, the utility dies are configured to communicate with one another through the global links, each of the utility dies is connected to at least one of the local links and is configured to communicate with at least one of the functional dies through the at least one of the local links; and (4) an antenna integrated on the substrate.

In some embodiments, the antenna is integrated via a fused silica substrate technique.

In some embodiments, the antenna is integrated via a PDMS substrate technique.

In some embodiments, the antenna is a patch antenna.

As used herein, the singular terms "a," "an," and "the" may include plural referents unless the context clearly dictates otherwise. Thus, for example, reference to an object may include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the terms "connect," "connected," and "connection" refer to an operational coupling or linking. Connected objects can be directly coupled to one another or can be indirectly coupled to one another, such as via one or more other objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be "substantially" or "about" the same as a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In the description of some embodiments, an object provided "on," "over," "on top of" or "below" another object can encompass cases where the former object is directly adjoining (e.g., in physical or direct contact with) the latter object, as well as cases where one or more intervening objects are located between the former object and the latter object.

Additionally, concentrations, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a range of about 1 to about 200 should be understood to include the explicitly recited limits of about 1 and about 200, but also to include individual values such as about 2, about 3, and about 4, and sub-ranges such as about 10 to about 50, about 20 to about 100, and so forth.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, operation or operations, to the objective, spirit and scope of the disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not a limitation of the disclosure.

What is claimed is:

1. A system for interconnecting a plurality of functional dies on a single substrate, comprising:
   a plurality of global links in the substrate;
   a plurality of local links in the substrate; and
   a plurality of utility dies on the substrate, wherein each of the utility dies is connected to at least one of the global links, the utility dies are configured to communicate with one another through the global links, each of the utility dies is connected to at least one of the local links and is configured to communicate with at least one of the functional dies through the at least one of the local links.

2. The system of claim 1, wherein each of the utility dies includes an input queue to receive incoming data from one or more of the global links and one or more of the local links, and includes a multiplexer to provide outgoing data to one or more of the global links and one or more of the local links.

3. The system of claim 2, wherein each of the utility dies includes a processing core configured to direct operation of the input queue and the multiplexer to route incoming data received by the input queue to a selected link through the multiplexer.

4. The system of claim 3, wherein the processing core is configured to route the incoming data to the selected link according to a priority assigned to the incoming data.

5. The system of claim 3, wherein each of the utility dies includes a set of repeater circuits connected between the input queue and the multiplexer.

6. The system of claim 5, wherein the processing core is configured to route the incoming data received by the input queue to the multiplexer via the set of repeater circuits.

7. The system of claim 6, wherein the incoming data is received from a source functional die connected to the input queue, and the processing core is configured to route the incoming data to a destination functional die connected to the multiplexer.

8. The system of claim 1, wherein each of the utility dies includes a power regulation circuit configured to regulate a received voltage to a local voltage to be supplied to at least one of the functional dies disposed adjacent to the utility die.

9. The system of claim 8, wherein each of the utility dies includes a power management circuit connected to the power regulation circuit.

10. The system of claim 9, wherein each of the utility dies includes a plurality of power regulation circuits to supply respective, different local voltages, and the power management circuit is connected to the power regulation circuits.

11. The system of claim 9, wherein each of the utility dies includes a power-gating circuit connected to the power management circuit.

12. The system of claim 9, wherein each of the utility dies includes a decoupling capacitor connected to the power management circuit.

13. The system of claim 1, wherein each of the utility dies includes a clock circuit configured to generate a local clock signal to be supplied to at least one of the functional dies disposed adjacent to the utility die.

14. The system of claim 1, wherein each of the utility dies includes a plurality of clock circuits to supply respective, different local clock signals.

15. The system of claim 1, wherein each of the utility dies includes a built-in self-test circuit configured to perform tests of the system.

16. The system of claim 1, wherein the utility dies are configured to perform redundancy allocation in an event of a failure of one of the utility dies or one of the functional dies.

17. A system comprising:
a single substrate to accommodate a plurality of functional dies on the substrate, wherein the substrate includes:
a plurality of global links in the substrate, and
a plurality of local links in the substrate; and
a plurality of utility dies on the substrate, wherein each of the utility dies is connected to at least one of the global links, the utility dies are configured to communicate with one another through the global links, each of the utility dies is connected to at least one of the local links and is configured to communicate with at least one of the functional dies through the at least one of the local links.

18. The system of claim 17, wherein the substrate is a silicon substrate.

19. The system of claim 17, wherein each of the utility dies includes:
an input queue to receive incoming data from one or more of the global links and one or more of the local links,
a multiplexer to provide outgoing data to one or more of the global links and one or more of the local links, and
a processing core configured to direct operation of the input queue and the multiplexer to route incoming data received by the input queue to a selected link through the multiplexer.

20. The system of claim 17, wherein each of the utility dies includes a power regulation circuit configured to regulate a received voltage to a local voltage to be supplied to at least one of the functional dies disposed adjacent to the utility die.

21. A system for interconnecting a plurality of components on a single substrate, comprising:
a plurality of global links in the substrate;
a plurality of local links in the substrate;
a plurality of utility dies on the substrate, wherein each of the utility dies is connected to at least one of the global links, the utility dies are configured to communicate with one another through the global links, each of the utility dies is connected to at least one of the local links and is configured to communicate with at least one of the functional dies through the at least one of the local links; and
an antenna integrated on the substrate.

22. The system of claim 21, wherein the antenna is integrated via a fused silica substrate technique.

23. The system of claim 21, wherein the antenna is integrated via a PDMS substrate technique.

24. The system of claim 21, wherein the antenna is a patch antenna.

* * * * *